United States Patent
Jang et al.

(10) Patent No.: US 10,692,561 B2
(45) Date of Patent: Jun. 23, 2020

(54) SEMICONDUCTOR MEMORY DEVICE, MEMORY SYSTEM, AND REFRESH METHOD THEREOF

(71) Applicant: Samsung Electronics Co., Ltd., Suwon-si (KR)

(72) Inventors: Min-soo Jang, Seoul (KR); Eunsung Seo, Seoul (KR); Seungjun Bae, Hwasung-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 49 days.

(21) Appl. No.: 16/032,361

(22) Filed: Jul. 11, 2018

(65) Prior Publication Data

US 2019/0139596 A1 May 9, 2019

(30) Foreign Application Priority Data

Nov. 6, 2017 (KR) .................. 10-2017-0146808

(51) Int. Cl.
*G11C 11/40* (2006.01)
*G11C 11/406* (2006.01)
(Continued)

(52) U.S. Cl.
CPC ...... *G11C 11/40615* (2013.01); *G11C 7/1063* (2013.01); *G11C 11/4087* (2013.01);
(Continued)

(58) Field of Classification Search
CPC ........ G11C 11/40615; G11C 11/40603; G11C 7/1063; G11C 11/4087; G11C 11/40626; G11C 11/40622; G11C 11/40618
See application file for complete search history.

(56) References Cited

U.S. PATENT DOCUMENTS 6,266,738 B1   7/2001   Kobayashi
7,133,996 B2   11/2006  Ikeda et al.
(Continued)

FOREIGN PATENT DOCUMENTS

KR   10-0612950 B1   8/2006
KR   10-0838375 B1   6/2008
KR   2014-0081346 A  7/2014

OTHER PUBLICATIONS

Tovletoglou et al., "Relaxing DRAM Refresh Rate through Access Pattern Scheduling: A Case Study on Stencil-based Algorithms," 23rd IEEE International Symposium on On-Line Testing and Robust System Design 2017: Proceedings (pp. 1-6).
(Continued)

*Primary Examiner* — Mohammed A Bashar
(74) *Attorney, Agent, or Firm* — Muir Patent Law, PLLC

(57) ABSTRACT

A semiconductor memory device includes a cell array that includes a plurality of DRAM cells to store data, and refresh control logic that refreshes the plurality of DRAM cells depending on access scenario information provided from an outside. The refresh control logic determines a refresh time of the plurality of DRAM cells with reference to the access scenario information and a retention characteristic of the plurality of DRAM cells and refreshes the plurality of DRAM cells depending on the determined refresh time.

19 Claims, 14 Drawing Sheets

(51) Int. Cl.
*G11C 7/10* (2006.01)
*G11C 11/408* (2006.01)
*H04N 5/335* (2011.01)

(52) U.S. Cl.
CPC .. *G11C 11/40603* (2013.01); *G11C 11/40626* (2013.01); *G11C 11/40618* (2013.01); *G11C 11/40622* (2013.01); *H04N 5/3355* (2013.01)

(56) References Cited

U.S. PATENT DOCUMENTS

| | | |
|---|---|---|
| 7,145,814 B2 | 12/2006 | Park |
| 7,327,625 B2 | 2/2008 | Jo |
| 7,394,712 B2 | 7/2008 | Do |
| 7,454,586 B2 | 11/2008 | Shi et al. |
| 8,077,537 B2 | 12/2011 | Kawakubo et al. |
| 9,147,461 B1 * | 9/2015 | Youn ................... G11C 7/1045 |
| 9,460,774 B1 | 10/2016 | Lee |
| 2007/0253269 A1 * | 11/2007 | Pyeon ...................... G11C 7/04 |
| | | 365/222 |
| 2014/0016421 A1 | 1/2014 | Kim et al. |
| 2016/0224272 A1 | 8/2016 | Kim |
| 2016/0254043 A1 | 9/2016 | Yang |
| 2017/0062038 A1 | 3/2017 | Doo et al. |
| 2017/0117033 A1 | 4/2017 | Doo et al. |
| 2017/0148504 A1 | 5/2017 | Saifuddin et al. |

OTHER PUBLICATIONS

Aditya Agrawal, "Refresh Reduction in Dynamic Memories," Dissertation in the Graduate College of the University of Illinois at Urbana-Champaign, Jan. 21, 2015 (106 pages).

* cited by examiner

FIG. 6A

| Total Refresh Time (tREF_tot) | MRW |
|---|---|
| 8ms ≤ tREF_tot < 256ms | 00 |
| 4ms ≤ tREF_tot < 8ms | 01 |
| 2ms ≤ tREF_tot < 4ms | 10 |
| tREF_tot < 2ms | 11 |

FIG. 6B

| Acceptable Fail Bit Number | tREF | MRW |
|---|---|---|
| All Guarantee | 32ms | 00 |
| 0 < tot ≤ 10bit | 128ms | 01 |
| 11 < tot ≤ 100bit | 256ms | 10 |
| No Guarantee | 256ms~ | 11 |

SEMICONDUCTOR MEMORY DEVICE, MEMORY SYSTEM, AND REFRESH METHOD THEREOF

CROSS-REFERENCE TO RELATED APPLICATIONS

This application claims priority under 35 U.S.C. § 119 to Korean Patent Application No. 10-2017-0146808 filed Nov. 6, 2017, in the Korean Intellectual Property Office, herein incorporated by reference in its entirety.

BACKGROUND

Embodiments of the inventive concept disclosed herein relate to a semiconductor memory device, semiconductor memory device operations, a memory system including the same, and a refresh method thereof.

The capacity and speed of a semiconductor memory device used in various electronic systems is increasing in response to the demand of high performance from users. With respect to volatile memory devices, such as dynamic random access memory (DRAM), data is stored in the form of charges stored in a memory cell capacitor. Since charges stored in the memory cell capacitor leak as time goes on, the DRAM has a finite data retention characteristic.

To address this finite data retention characteristic, DRAM performs a refresh operation to retain data stored in the memory cell capacitor. A memory controller, such as a DRAM controller, that accesses the DRAM may manage and control the DRAM, for example, by allowing the DRAM to perform its refresh operations at a timing determined by the DRAM or by providing refresh instructions at timing determined by the DRAM controller. The DRAM may refresh its memory cells at a given period depending on a refresh command provided from the host. However, system complexity of the host may increase in order to control the refresh operation. The DRAM may also include components such as a command decoder, a timer, and the like for the purpose of decoding an external command and performing the refresh operation.

In some systems, data is read from and written to the DRAM at a preset time based on a given scenario or particular use. Thus, such accesses to the DRAM may not be typical random accesses. For example, in the case where the DRAM is used as a frame buffer that temporarily stores image data, an image processing processor accesses the DRAM regularly based on a particular scenario, not randomly.

When accessing the DRAM based on a particular scenario, the DRAM may perform a refresh operation when possible without an additional external refresh command. In the case of the DRAM that is accessed based on the scenario, the efficiency of the refresh operation may be improved, thereby making it possible to implement simplification and low power of a system.

SUMMARY

Embodiments of the inventive concept provide a semiconductor memory device, system and a refresh method capable of improving efficiency of a refresh operation of the semiconductor memory device being accessed based on a particular scenario.

According to an exemplary embodiment, a semiconductor memory device includes a cell array that includes a plurality of DRAM cells to store data, and refresh control logic that refreshes the plurality of DRAM cells depending on access scenario information provided from an external source. The refresh control logic is configured to determine a refresh time of the plurality of DRAM cells with reference to the access scenario information and a retention characteristic of the plurality of DRAM cells and is configured to refresh the plurality of DRAM cells depending on the determined refresh time.

According to an exemplary embodiment, a memory system includes a host that records and reads data in a buffer during a data retention time depending on an access scenario, and a DRAM. The DRAM is provided as the buffer of the host and is configured to operate in accordance with time information of the access scenario received from the host. The DRAM is configured to perform self-refresh operations on a memory area where the data are recorded. Such self-refresh operations may be limited to a non-operation period where an access of the host to the data is not permitted during the data retention time. The self-refresh operation of the DRAM may use the time information and be enabled by an external refresh enable signal.

According to an exemplary embodiment, a refresh method of a semiconductor memory device in which data are written and read based on a scenario includes receiving a data retention time according to an access scenario and a length of a non-operation period included in the data retention time from an external device, calculating a refresh time of a memory area where the data are written, by using the length of the non-operation period and a characteristic parameter of memory cells, and refreshing the memory area at a timing depending on the calculated refresh time during the non-operation period.

BRIEF DESCRIPTION OF THE FIGURES

The above and other objects and features of the inventive concept will become apparent by describing in detail exemplary embodiments thereof with reference to the accompanying drawings.

FIGS. 6A and 6B are tables illustrating exemplary configurations of a refresh mode register illustrated in FIG. 5.

DETAILED DESCRIPTION

Figure 1:
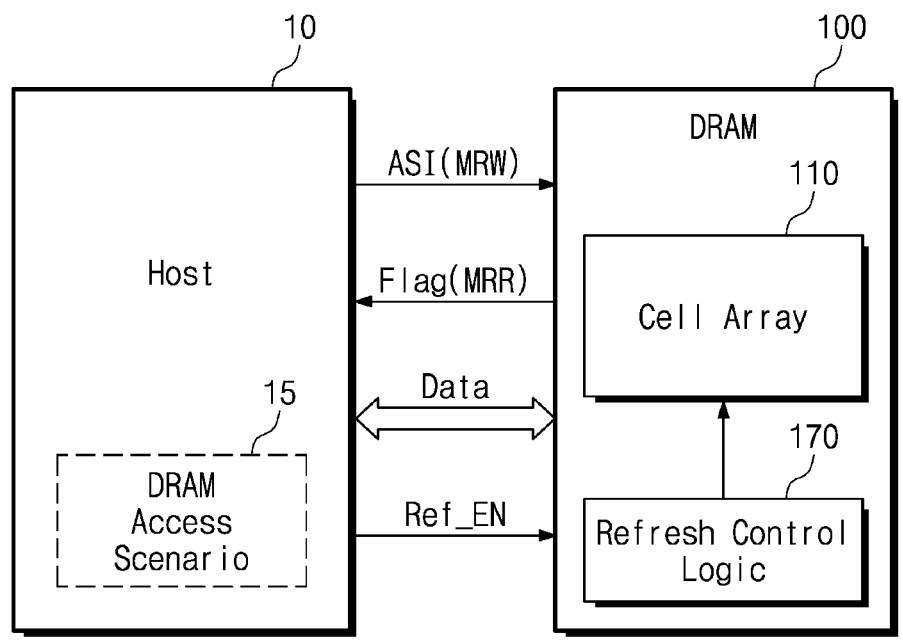
FIG. 1 is a block diagram illustrating a memory system according to an embodiment of the inventive concept.

It should be understood that the following detailed description are provided as examples. The same reference numerals are used in the drawings and the description to indicate the structure referenced may be the same as that disclosed elsewhere.

Below, a synchronous DRAM (SDRAM) is used as an example of a semiconductor device to describe features and functions of the inventive concept. However, it should be understood that the invention is applicable to other types of memory. FIG. 1 is a block diagram illustrating a memory system according to an embodiment of the inventive concept, including a host 10 and a DRAM 100. The DRAM 100 may be formed as an integrated circuit (IC) in a single semiconductor chip that is separate from one or more semiconductor chips forming host 10. However, DRAM 100 may be formed as an integrated circuit within the same semiconductor chip forming all or part of host 10. It should be appreciated that while this disclosure is described with respect to a single DRAM 100, several DRAMs 100 may be used in a system with host 10 as described herein with respect to a single DRAM 100 (several DRAM semiconductor chips may be used to buffer blocks of data, such as frame image data, provided by host 10).

The host 10 may use the DRAM 100 as a buffer, a working memory, or a main memory. The host 10 may access the DRAM 100 based on a scenario. For example, the host 10 may access the DRAM 100 in a way to write data of a fixed capacity and retain the stored data only for a given, preset time. The host 10 may use the DRAM 100 as a scenario-based buffer memory. A frame buffer that is used in a system, such as a mobile phone, an application processor (AP) for digital television (TV), a device for frame rate control (FRC), or the like, may be controlled according to a scenario-based access.

The host 10 may be internally configured to include a fixed DRAM access scenario 15 for accessing the DRAM 100. The access of the host 10 to the DRAM 100 may be made in compliance with rules of the DRAM access scenario 15. The host 10 may transmit access scenario information ASI to the DRAM 100 based on the DRAM access scenario 15. The access scenario information ASI may be provided in a variety of ways. In this example, the access scenario information ASI is transmitted to the DRAM 100 as part of a mode register write (MRW) (e.g., provided with a command to write to a mode register (e.g., of a mode register set) of the DRAM 100).

The DRAM 100 may perform a refresh operation of a cell array 110 depending on the access scenario information ASI provided from the host 10. Refresh control logic 170 calculates an optimal refresh time for refreshing the cell array 110 with reference to the mode register of the DRAM 100 (not illustrated) in which the access scenario information ASI is written. The refresh time may be a timing of when various rows of memory cells of the DRAM 100 are refreshed. The refresh control logic 170 may perform a refresh operation on memory cells in response to the optimal refresh time calculated.

Figure 2:
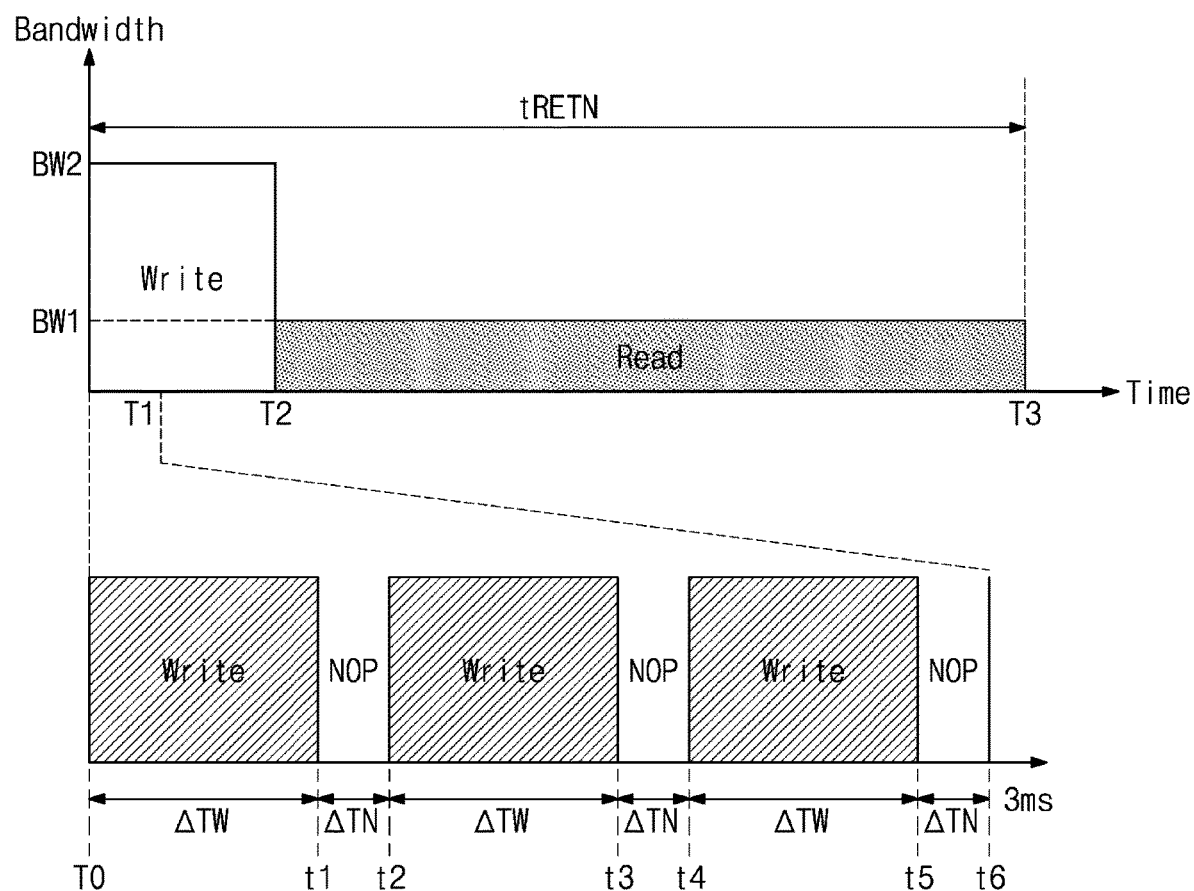
FIG. 2 is a view illustrating a way for a host to access a DRAM based on a scenario.

FIG. 2 is a view illustrating a way for a host to access a DRAM based on a scenario. Referring to FIG. 2, the host 10 may write data in the DRAM 100 up to a time T2 and may then read the written data up to a time T3. When the DRAM 100 is used as a frame buffer of an image processing device, data may be input and output according to a particular access scenario.

For example, each frame of a video image may be read and written to the DRAM 100 according the following access scenario. First, the host 10 writes data in the DRAM 100 up to the time T2. For example, sensed image data (which may be a frame of a video image, e.g.) may be written in the DRAM 100 during the time T2. It may be understood from FIG. 2 that a bandwidth BW2 of the DRAM 100 in a write operation is greater than a bandwidth BW1 of the DRAM 100 in a read operation. If the write operation is completed, a device such as an image signal processor (ISP) may read the data written in the DRAM 100 up to the time T3 for the purpose of processing image data. Accordingly, the data written in the DRAM 100 between time T0 and time T2 should be retained up to the time T3. This may mean that DRAM refresh operations are performed during a time period T0 to T3 in which the written data (e.g., a frame of image data) is buffered. This time period T0 to T3 in which written data should be retained in DRAM 100 is referred to herein as "data retention time" and labeled as "tRETN." The data retention time tRETN may be greater than the time the DRAM 100 may store data without a refresh operation, such as n×tREFmax, where tREFmax is the maximum refresh period of normal cells of the DRAM and n is an integer equal to 2 or more. After the data retention time tRETN expires at time T3, the data in the DRAM no longer need be retained and refresh operations may terminate to avoid refresh operations for the data thereby avoiding subsequent refresh operations on the rows of memory storing such data (e.g., thereby making that data unrecoverable from the DRAM without writing the data back into the DRAM) until the next data block is stored in the DRAM according to the access scenario.

An example of the host 10 writing data in the DRAM 100 during period T0 to T1 (part of a write period T0 to T2) is illustrated in detail on the bottom of FIG. 2. In the write period subinterval T0 to t1, data may be continuously provided to the DRAM 100, and the DRAM 100 may store this received data in memory its cells. Following the write period subinterval T0 to t1, a non-operation period (NOP) t2 to t3 is provided during which the host 10 may perform operations other than access operations of the DRAM 100. The host 10 may write data in the DRAM 100 in a write period subinterval t2 to t3. After the writing of data is suspended during a non-operation period (NOP) t3 to t4, the writing of data is resumed at a time point t4 in another subsequent write period subinterval. This sequence of write period subintervals interleaved with non-operation periods (NOP) may be continuously performed over the write period T0 to T2 to complete the writing of the data according to the predetermined scenario (e.g., to complete the writing of a frame of image data).

A length ΔTW of a write period subinterval where data are written in the DRAM 100 and a length ΔTN of the non-operation period may be fixed in value. That is, data written during each write period subinterval over a uniform period (i.e., having the same time duration), and writing of data is suspended between each write period subinterval over a uniform period (i.e., NOP periods between each of the write period subintervals may have the same duration). Although not shown in detail, non-operation periods NOP may also be provided within the read period between T2 and T3, and such non-operation periods NOP may have the same duration and frequency during the read period as described with respect to the write operations during the write period between T0 and T2.

The host 10 has the duration value of the data retention time tRETN when one data unit (e.g., one image frame or one block of data) should be retained after being written in the DRAM 100. Also, the host 10 may have the duration value of the non-operation period NOP in which a write operation or a read operation is suspended. The information may be provided to the DRAM 100 as the access scenario information ASI. The DRAM 100 may determine the following by using the access scenario information ASI: whether a refresh operation should be performed within the data retention time tRETN, a refresh time, and the like.

Figure 3:
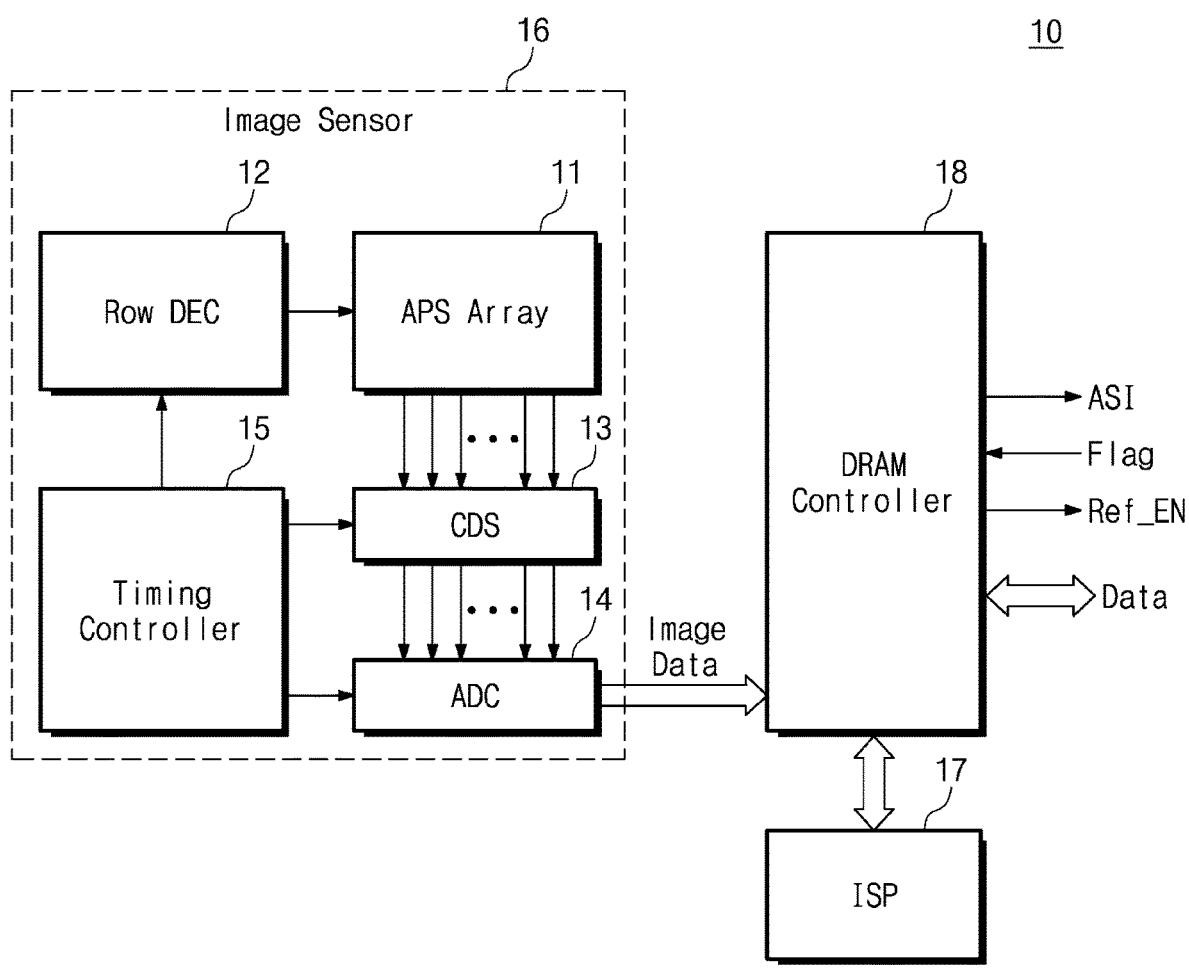
FIG. 3 is a block diagram illustrating an example of the host of FIG. 1.

FIG. 3 is a block diagram illustrating an example of a host of FIG. 1. Referring to FIG. 3, the host 10 may be implemented with an image processing system that senses and processes an image. The host 10 may include an image sensor 16, an image signal processor (ISP) 17, and a DRAM controller 18.

The image sensor 16 may include an active pixel sensor (APS) array 11, a row decoder 12, a correlated double sampler (CDS) circuit 13, an analog-to-digital converter 14, and a timing controller 15. The timing controller 15 may embody all or part of the DRAM access scenario 15, such as being configured (such as by software or firmware) to provide timing to obtain and store blocks of data according to a predetermined sequence at predetermined times (such as determined by rules as set forth in software configuring the timing controller 15). The DRAM access scenario 15 may also be embodied in different manners, such as by a similar configuration of image signal processor 17. The active pixel sensor array 11 may include a plurality of pixels arranged two-dimensionally. Each of the pixels comprises a photodetector (e.g., a photodiode) that converts light into an electrical signal. The active pixel sensor array 11 provides electrical signals from respective pixels in response to timing signals to the correlated double sampler circuit 13 through a plurality of column lines. The row decoder 12 may select any one row of the active pixel sensor array 11 under control of the timing controller 15. The correlated double sampler circuit 13 may transmit a reference signal REF and/or an image signal IMG of each of columns sampled under control of the timing controller 15 in units of a plurality of columns to the analog-to-digital converter 14. The analog-to-digital converter 14 may convert a correlated double sampling signal REF/IMG associated with each column, which is output from the correlated double sampler circuit 13, into a digital signal. The image sensor 16 may be a CMOS image sensor or a charge coupled device (CCD) image sensor, for example.

The image signal processor 17 processes image data generated by the image sensor 16. The image signal processor 17 processes image data in the form of raw data output from the image sensor 16. The image signal processor 17 may perform correction processing of an optical system such as a lens or pixel-based processing, such as correction of a defect generated due to deviation of an image sensor. The image signal processor 17 may be implemented in the form of an intellectual property (IP) core formed as a logic circuit in the image sensor 16. For example, the image signal processor 17 and image signal processor 17 may be formed as part of the same semiconductor chip.

The DRAM controller 18 writes image data output from the image sensor 16 in the DRAM 100 to buffer the image data in DRAM 100. The DRAM controller 18 reads data stored in the DRAM 100 and outputs the read data to the image signal processor 17. For example, after storing a frame of image data in the DRAM 100, the DRAM controller 18 may transmit the frame of image data to the image signal processor 17. As described with reference to FIG. 2, operations of storing and reading image data are performed based on a predetermined scenario. That is, write operations and read operations associated with one frame of image data are performed during a predetermined time and/or at predetermined time intervals (e.g., at predetermined time intervals within the predetermined time associated with buffering one frame of image data in DRAM 100 and/or image processing of one frame of image data).

The DRAM controller 18 provides the access scenario information ASI to the DRAM 100 for a scenario-based access. The DRAM 100 may perform a refresh operation depending on the access scenario information ASI. The access scenario information ASI may be provided to the DRAM controller 18 as mode register write (MRW) information. The DRAM controller 18 may provide the DRAM 100 with a refresh enable signal Ref_EN to enable a refresh operation of the DRAM 100. The refresh enable signal Ref_EN may be activated by host 10, for example, in the non-operation period NOP when there is no external access to the data of the DRAM 100.

Figure 4:
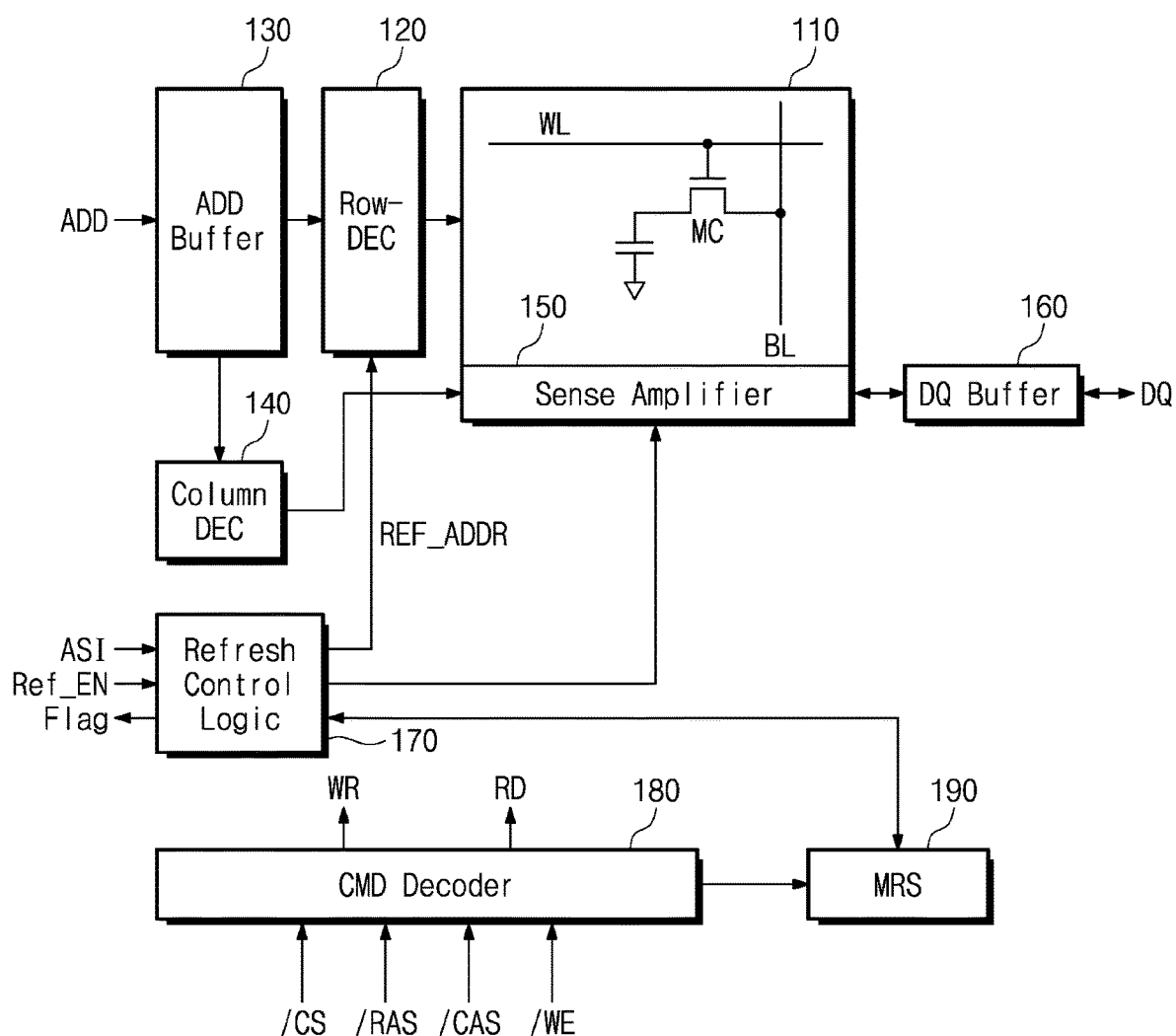
FIG. 4 is a block diagram illustrating the DRAM that performs a scenario-based refresh operation according to an embodiment of the inventive concept.

FIG. 4 is a block diagram illustrating a DRAM that performs a scenario-based refresh operation according to an embodiment of the inventive concept. Referring to FIG. 4, the DRAM 100 may include the cell array 110, a row decoder 120, an address buffer 130, a column decoder 140, a sense amplifier 150, a data buffer 160, the refresh control logic 170, a command decoder 180, and a mode register set 190.

The cell array 110 includes a plurality of memory cells MC that are connected with word lines WL and bit lines BL and are arranged in a row direction and a column direction. Each of the memory cells may include a cell capacitor and an access transistor. In each memory cell, a gate of the access transistor is connected to a corresponding one of the word lines WL arranged in the row direction. A first end of the access transistor is connected to a corresponding bit line BL extending in the column direction. A second end of the access transistor is connected to the memory cell capacitor of the memory cell MC.

The row decoder 120 selects a word line to select a row of memory cells to be accessed, in response to an address ADD input to the row decoder 120. The row decoder 120 decodes the input address ADD and enables a word line corresponding to the decoded address. Also, in a self-refresh mode of operation, the row decoder 120 may decode a row address generated from an address counter (outputting a refresh address REF_ADDR corresponding to an address of a row to be refreshed) of the refresh control logic 170 (not illustrated) and may enable a word line corresponding to the decoded address. In the self-refresh mode, the row address generated by the address counter of the refresh control logic may be incremented by a refresh clock Ref_CLK described herein. The column decoder 140 selects one or more bit lines to input our output data to a portion of the row of memory cells corresponding to the selected (enabled) word line.

The address buffer 130 temporarily stores the address ADDR input from an external device (e.g., input from DRAM controller 18). The address buffer 130 supplies the stored address to the row decoder 120 (e.g., a row address) and/or the column decoder 140 (e.g., a column address). The timing and format of the address ADD received by the DRAM 100 may be modified by the address buffer 130.

The sense amplifier 150 writes data or senses previously written data of a corresponding memory cell connected to the selected word line. The sense amplifier 150 may sense and output data stored in a memory cell through a bit line. Also, the sense amplifier 150 may latch input data which is subsequently stored in a corresponding memory cell. In a refresh operation, the sense amplifier 150 may sense the data stored in a corresponding memory cell and in doing so, recharge the memory cell capacitor of the memory cell (e.g., to the full charge state representing a "0" or "1" logic value). The sense amplifier 150 may perform a refresh operation on selected memory cells (e.g., a row of memory cells corresponding to the selected word line) under control of the refresh control logic 170. During the refresh operation, a selected memory cell may connect its memory cell capacitor to a bit line BL through the memory cell transistor, causing the memory cell capacitor charge (representing the memory cell data) to alter the potential of the bit line BL (e.g., increase or decrease the potential of the bit line BL). A sense amplifier 150 connected to this bit line BL may sense and latch data of a corresponding selected memory cell, pulling the bit line BL to either a high potential or low potential through this latching operation. In doing so, the sense amplifier provides the high or low potential through the bit line BL to the selected memory cell thus refreshing the memory cell. Although not illustrated in FIG. 4, for the refresh operation, the sense amplifier 150 may include an N-type sense amplifier NSA that discharges a low-potential bit line of bit lines BL and BLB and a P-type sense amplifier PSA that charges a high-potential bit line of the bit lines BL and BLB. Although the above description is in connection with a single sense amplifier and a single memory cell connected to single selected word line WL, it will be appreciated that cell array 110 comprises a plurality of sense amplifiers connected to a plurality of respective bit lines that may simultaneously access a selected row of memory cells (a row of memory cells connected to a selected one of the plurality of word lines WL). Thus, block 150 will be understood to generically refer to a sense amplifier array, comprising a plurality of sense amplifiers (which may be regularly distributed throughout the memory cell array 110).

The refresh control logic 170 may be a logic circuit that performs the refresh operation of the cell array 110 by using the access scenario information ASI provided from the host 10. The refresh control logic 170 may perform the refresh operation of the DRAM 100 in a self refresh mode of the DRAM 100 where each refresh operation of the DRAM 100 is scheduled at a timing determined by the refresh control logic 170 without control of the command decoder 180. For example, when the DRAM 100 is in the self refresh mode and/or performing self refresh operations, refresh operations of the DRAM 100 do not result from a refresh command received from an external device, such as from DRAM controller 18. The DRAM 100 may be set in the self refresh mode in response to an enter self refresh command received from DRAM controller 18. The refresh control logic 170 may obtain the data retention time tRETN defined in an access scenario of the host 10 from the access scenario information ASI. The refresh control logic 170 may obtain durations and the number of non-operation periods NOP existing within the data retention time tRETN from the access scenario information ASI, and may calculate the total duration of all of the non-operation periods within a data retention time. Accordingly, a refresh time tRC for each word line may be determined to refresh the word lines based on the total duration of all of the non-operation periods within a data retention time. The refresh time tRC may correspond to an activate-to-activate internal refresh command period and denote a minimum time between the start times of consecutively performed refresh operations (or a minimum time between the initiation of internal refresh commands for consecutively performed refresh operations). For example, tRC may be the minimum time between activating word lines driven by the same row decoder—such as row decoder 120—within the same bank of memory cells of the cell array 110. A frequency of a refresh clock Ref_CLK may be determined and set using the determined refresh time tRC.

In some examples, the refresh control logic 170 may determine an optimal refresh time tRC_opt between successive refresh operations based upon the number of rows to be refreshed and one or more cell characteristics of the memory cells. The refresh control logic 170 may perform the refresh operations within a non-operation period at a timing determined by the determined optimal refresh time tRC_opt. For example, the refresh control logic 170 may perform the refresh operations on memory cells at timings depending on the determined optimal refresh time tRC_opt during a period where the refresh enable signal Ref_EN is activated (e.g., corresponding to the non-operation period). Optimal refresh time tRC_opt may correspond to an adjusted value of refresh time tRC (and an adjusted frequency of Ref_CLK output by refresh clock controller 173, 273) as described herein. If the access scenario information ASI provided from the host 10 provides a refresh-possible time that is insufficient to refresh all necessary rows, the refresh control logic 170 may notify the outside that a time to perform the needed refresh operations is insufficient, such as in the mode register read (MRR) manner.

The command decoder 180 determines an input external command with reference to signals /RAS, /CAS, and /WE received from an external source, such as from DRAM controller 18. The command decoder 180 may write or read data in or from the cell array 110 in response to an appropriate external command. Also, the command decoder 180 may write data in the mode register set 190 in response to an external mode register write command and an address received from an external source. The command decoder 180 may decode an auto refresh command and to initiate a refresh operation. In general, an auto refresh operation may be input through a combination of the control signals /RAS, /CAS, and /WE. In this case, a timing of the refresh operation is responsive to the auto refresh command received by the command decoder 180, and an internal refresh command is provided to the refresh control logic 170 by the command decoder 180. As described above, the DRAM 100 of the inventive concept may determine the refresh time tRC for refreshing respective rows of the memory array 110 or a selected memory area of the memory array 110 by using the access scenario information ASI received from an external source. The DRAM 100 may perform the refresh operations during a non-operation period where the externally provided refresh enable signal Ref_EN is activated, depending on the determined refresh time. During any one continuous period of activation of the refresh enable signal Ref_EN, a plurality of refresh operations initiated in accordance with the timing of Ref_CLK may be sequentially and performed at regular intervals equal to tRC.

Figure 5:
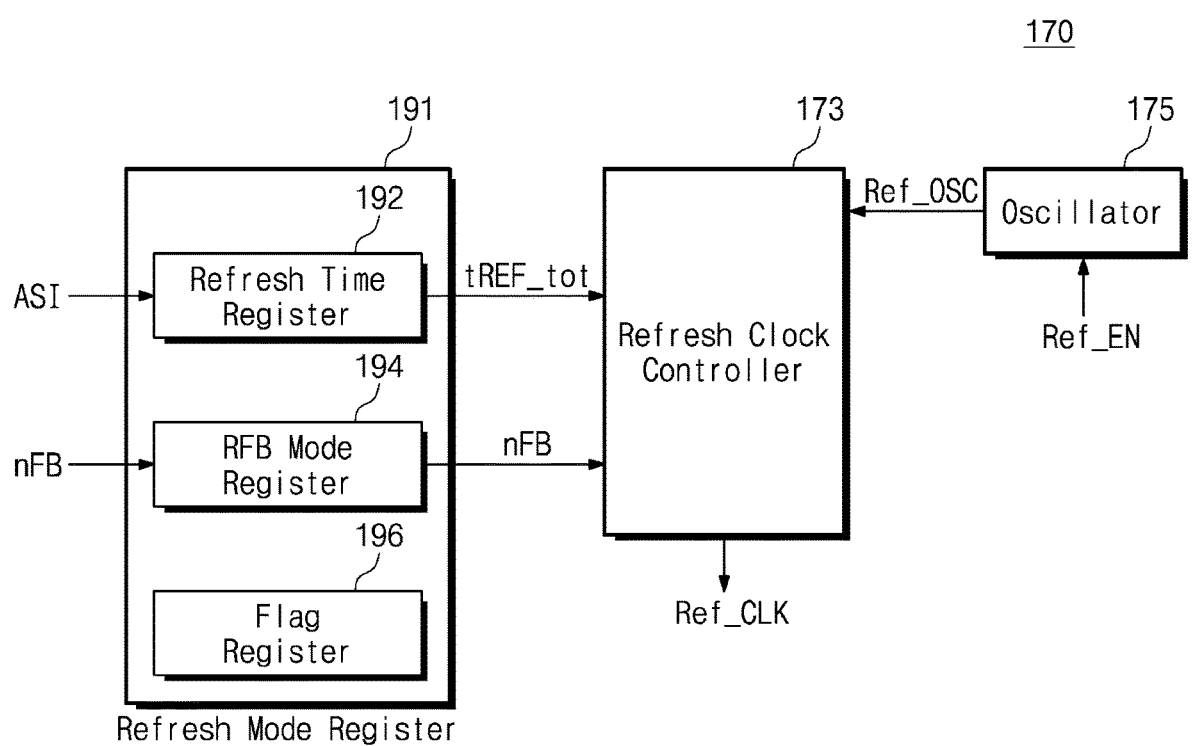
FIG. 5 is a block diagram illustrating an exemplary configuration of refresh control logic of FIG. 4.

FIG. 5 is a block diagram illustrating an exemplary configuration of refresh control logic of FIG. 4. Referring to FIG. 5, the refresh control logic 170 may include a refresh clock controller 173 and an oscillator 175 that generates an internal clock Ref_Osc.

FIG. 5 illustrates that the refresh clock controller 173 has access to refresh mode registers 191 constituting various mode registers of the mode register set 190 including a refresh time register 192, a fail bit mode register 194 and a flag register 196. The refresh time register 192 stores the total refresh time tREF_tot included in the access scenario information ASI, and the total refresh time tREF_tot may be the total duration when self-refresh operations can be performed during the data retention time tRETN. For example, a sum of the durations of all non-operation periods occurring within the data retention time tRETN may be the total refresh time tREF_tot. The refresh time register 192 may also store the data retention time tRETN that indicates the duration that one data unit (e.g., a frame of image data) should be stored by the DRAM 100.

The fail bit mode register 194 is a register for providing a refresh period tREF of a cell and/or row of memory cells (e.g., a row of memory cells connected to a word line) according to the number of allowable fail bits nFB. Fail bit mode register may be programmed with a value from host 10 (e.g., through a MRW operation) to provide a refresh period tREF for each row according to an acceptable bit error level. The refresh period tREF may apply to all rows of memory cells (or to all rows of normal memory cells) of the cell array 110. The bit error level may depend on an error correction capability of an error correction circuit (ECC) provided within the DRAM 100 and the frequency of refresh operations of each memory cell (e.g., frequency of refresh operations of a row or word line of memory cells). If the error correction capability is relatively great, a refresh period for each row may allowed to increase. Accordingly, it may be possible to reduce the frequency and number of refresh operations performed on respective rows if the number of allowable fail bits nFB is increased. The refresh period tREF may be the period between successive refresh operations of the same row of memory cells. In some examples, DRAM 100 may include weak memory cells and normal memory cells, where weak memory cells have been determined during a manufacturing testing process to require or otherwise benefit from a higher rate of refresh than normal memory cells. In such case, the refresh period tREF may be the period between successive refresh operations of the same row of memory cells for each of the rows that do not include such weak memory cells (e.g., a row of memory cells connected to the same word line that are all normal memory cells).

The flag register 196 is a register to store a flag input from refresh clock controller 173 to communicate the same to an external device via a MRR operation.

The oscillator 175 may selectively provide an internal clock to refresh clock controller 173. Internal clock Ref_Osc may comprise a regularly oscillating signal (e.g., regularly alternating between logic low and logic high state) in response to refresh enable signal Ref_EN having an enable state (i.e., active) and may comprise a fixed state (e.g., logic low or logic high) in response to refresh enable signal Ref_EN not having an enable state (e.g., a disable state). For example, oscillator 175 may comprise a flip-flop, such as a toggle flip flop, that toggles based on an input from an internal clock having a duty cycle of about 50% when enabled by refresh enable signal Ref_EN; when not enabled, the toggling of the flip flop may be disabled. A variety of other circuits may also be implemented for oscillator 175, such as gating (passing) or not gating a received internal clock based in response to refresh enable signal Ref_EN having an enable state or disable state, respectively.

The refresh clock controller 173 may determine the refresh time tRC with reference to the total refresh time tREF_tot and the number of fail bits nFB provided from the refresh mode register 191. The refresh clock controller 173 may adjust a frequency of the refresh clock Ref_CLK in accordance with the determined refresh time tRC. For example, the refresh clock controller 173 may generate refresh clock Ref_CLK (e.g., as a pulse, or a clock transition from high to low and/or low to high) every time period tRC. For example, a timer of refresh clock controller 173 may be formed from a counter receiving Ref_Osc as an incrementing input, a register storing a refresh time tRC value and a comparator comparing the refresh time tRC value of the register with the counter. Upon detecting the value of the counter equals the value of the refresh time tRC value, the comparator may output a logic high which is input to a reset input of the counter to cause the count value of the counter to reset to zero. Thus, the comparator may detect that the value of the counter does not equal the value of the refresh time tRC value in the register and transition to a logic low. The pulse output by the counter from this sequence may correspond to the refresh clock Ref_CLK. Generation and/or transition of the refresh clock Ref_CLK may correspond to an internal refresh command causing an internal refresh operation to be performed and may also cause the address counter (outputting a refresh address REF_ADDR corresponding to an address of a row to be refreshed—not illustrated) to be incremented. Thus, the refresh clock Ref_CLK may sequentially refresh the rows of the cell array 110 one by one every period equal to tRC during the periods in which the oscillator 175 is enabled. It should be appreciated that an internal refresh command provided by refresh clock Ref_CLK may be for sets of memory cells other than a row of memory cells connected to a selected word line. For example, a group of word lines may be selected by the address counter, and the refresh clock Ref_CLK may sequentially refresh the rows of the cell array 110 word line group by word line group every period equal to tRC during the periods in which the oscillator 175 is enabled. The group of word lines may be simultaneously refreshed in some examples, such as when each of the word lines is in a different independently operating bank of the cell array 110, or may be a group of sequentially addressed wordlines that are refreshed sequentially in a burst refresh operation caused by a reference clock Ref_CLK generation or transition FIGS. 6A and 6B are tables illustrating exemplary configurations of a refresh mode register illustrated in FIG. 5. FIG. 6A represents the refresh time register 192, and FIG. 6B represents the fail bit mode register 194.

Referring to FIG. 6A, a register value corresponding to the total refresh time tREF_tot provided from the host 10 is stored in the refresh time register 172. For example, in the case where the total refresh time tREF_tot corresponding to the total length of the non-operation period NOP is 8 ms or more and is shorter than 256 ms, the host 10 may write "00" in the refresh time register 172. In the case where the total refresh time tREF_tot corresponding to the total length of the non-operation period NOP is 4 ms or more and is shorter than 8 ms, the host 10 may write "01" in the refresh time register 172. In the case where the total refresh time tREF_tot corresponding to the total length of the non-operation period NOP is 2 ms or more and is shorter than 4 ms, the host 10 may write "10" in the refresh time register 172. However, in the case where the total refresh time tREF_tot corresponding to the total length of the non-operation period NOP is shorter than 2 ms, the host 10 may not write data in the refresh time register 172 or may write a value of "11." In this latter case, other or modified refresh operation schemes may be performed. As noted herein, the refresh register 192 may also store a value representing the total data retention time tRETN of the scenario.

FIG. 6B refers to the fail bit mode register 174. The fail bit mode register 174 may be set to denote the refresh period tREF. The refresh period tREF may be a maximum time period that should not be exceeded between sequential refresh operations of the same memory cell (e.g., the periodicity of refreshing the same row of memory cells). The refresh period tREF may be set according to the number of fail bits nFB that may be acceptable for a particular operation performed by the host 10 (e.g., such as processing a frame of a video image obtained from image sensor 16 as described herein). In the case where fail bits should not be generated, the refresh period tREF of a cell of 32 ms may be needed, and the host 10 may write "00" in the fail bit mode register 174 to set tREF to 32 ms. In the case where the number of fail bits of ten (10) bits or less is allowable, the refresh period tREF of 128 ms may be acceptable, and the host 10 may write "01" in the fail bit mode register 174 to set the refresh period tREF to 128 ms. When the number of fail bits may be more than eleven (11) bits but should be less than or equal to one hundred (100) bits, the refresh period tREF of 256 ms may be needed, and the host 10 may write "10" in the fail bit mode register 174 to set the refresh period tREF to 256 ms. When the number of allowable fail bits may be greater than one hundred (100) bits, the refresh period tREF may be set to 256 ms or more, and the host 10 may write "11" in the fail bit mode register 174 to set the refresh period to tREF. Depending on the data retention time tRETN and the set refresh period tREF, self refresh operations may be needed during the data retention time tRETN to satisfy the set refresh period tREF. In addition, use of error correction codes (ECC) for the stored data and an ECC circuit (which may be part of the DRAM 100 or external to the DRAM, such as part of DRAM controller 18) to detect and correct erroneous bits of data may be implemented and dependent on which refresh period tREF is set via the programming of the fail bit mode register 174.

Figure 7:
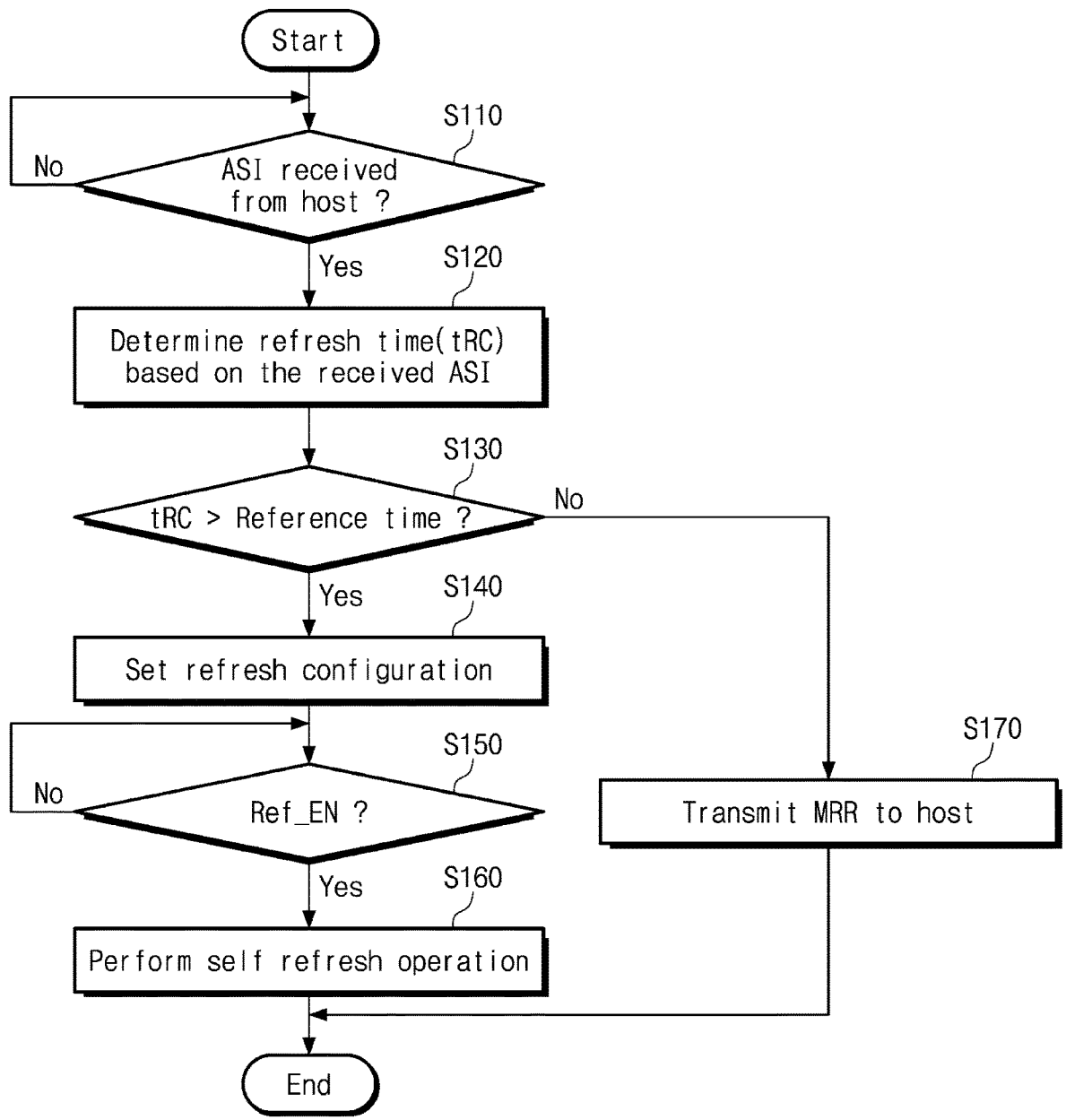
FIG. 7 is a flowchart illustrating an operation of the refresh control logic of FIG. 4.

FIG. 7 is a flowchart illustrating an operation of refresh control logic of FIG. 4. Referring to FIG. 7, the refresh control logic 170 may calculate the refresh time tRC for a self-refresh operation by using the access scenario information ASI provided from the host 10.

In operation S110, the refresh control logic 170 monitors whether the access scenario information ASI is transmitted from the host 10. The operation of monitoring the access scenario information ASI may start upon booting the DRAM 100 or upon booting or initializing a memory system (e.g., as part of a programmed boot-up sequence in which the system using the DRAM 100 is initialized). If it is determined that the access scenario information ASI is not received from the host 10 (No), the refresh control logic 170 may continue the monitoring operation associated with the access scenario information ASI. If it is determined that the access scenario information ASI is received from the host 10 (Yes), the procedure proceeds to operation S120.

In operation S120, the refresh control logic 170 may calculate the refresh time tRC for self-refresh operations using the access scenario information ASI provided from the host 10. For example, the refresh time tRC between refresh operations (e.g., between the initiation of refresh operations, such as between generation of internal refresh commands) may be calculated by dividing the total refresh time tREF_tot obtained from the access scenario information ASI by the number of rows. In some examples, the refresh time tRC may be calculated by dividing the portion of the total refresh time tREF_tot available over each refresh window tREFW (corresponding in length to the refresh period tREF) by the number of rows. The portion of the total refresh time tREF_tot available over each refresh window tREFW may be determined by dividing the total refresh time tREF_tot available by the number or refresh windows tREFW needed for the scenario, which may equal the scenario's total data retention time tRETN/tREF (as a refresh window tREFW is the interval which all rows to be refreshed should be refreshed, the refresh window tREFW duration corresponds to the refresh period tREF duration). The refresh period tREF may be the refresh period tREF set by the fail bit mode register 194. Thus, tRC may be calculated as tREF_tot/(tRETN/tREF)/the number of rows. The number of rows may be the number rows of the entire cell array 110 or may be the number of rows forming a subset of the rows of the cell array 110 that are used by the host for the scenario (as described elsewhere herein).

In operation S130, the calculated refresh time tRC is compared with a reference time. The case where the refresh time tRC is longer than the reference time (Yes) means that it is possible to perform a self-refresh operation in the DRAM 100 using the calculated refresh time tRC. Accordingly, the procedure proceeds to operation S140 for a refresh operation. The case where the calculated refresh time tRC is shorter than or equal to the reference time (No) means that the number of rows to be refreshed exceeds a self-refresh capability when limited to performing self-refresh only during non-operation periods NOP. Accordingly, the procedure proceeds to operation S170 for the purpose of notifying the outside of the DRAM 100 that it is impossible to refresh all rows within the total refresh time tREF_tot of the scenario.

In operation S140, the refresh control logic 170 may set a refresh operation parameter such that a refresh clock is generated according to the determined refresh time tRC. For example, a register of refresh clock controller 173 (as described above) may be have the calculated refresh time tRC stored therein (e.g., as a number of uninterrupted cycles of Ref_Osc equal to the calculated refresh time tRC).

In operation S150, the refresh control logic 170 monitors the refresh enable signal Ref_EN from the host 10. For example, the refresh enable signal Ref_EN may be activated in the non-operation period NOP. If the refresh enable signal Ref_EN is not activated, the refresh control logic 170 may continue to monitor activation of the refresh enable signal Ref_EN. If it is detected that the refresh enable signal Ref_EN is activated, the procedure proceeds to operation S160.

In operation S160, the refresh control logic 170 may perform self-refresh operations corresponding to the calculated refresh time tRC during a period where the refresh enable signal Ref_EN is activated. For example, the refresh control logic may perform self refresh operations at regular intervals spaced apart by the calculated refresh time tRC.

In operation S170, the refresh control logic 170 may notify an external source that it is impossible to refresh all rows at least once during the given total refresh time tREF_tot. For example, it may be possible to notify the host 10 that it is impossible to perform a refresh operation, through a mode register read (MRR) operation by writing a bit (e.g., logic high or logic low) in flag register 196 and causing the same to be read by DRAM controller 18.

The procedure in which the refresh control logic 170 of the inventive concept obtains the refresh time tRC by using the access scenario information ASI without a refresh command and performs a refresh operation is described above. However, the function of the refresh control logic 170 is not limited to the above-described example. As described above, the refresh control logic 170 may calculate the refresh time tRC by additionally using the number of allowable fail bits and may perform a self-refresh operation during the calculated refresh time tRC.

Figure 8:
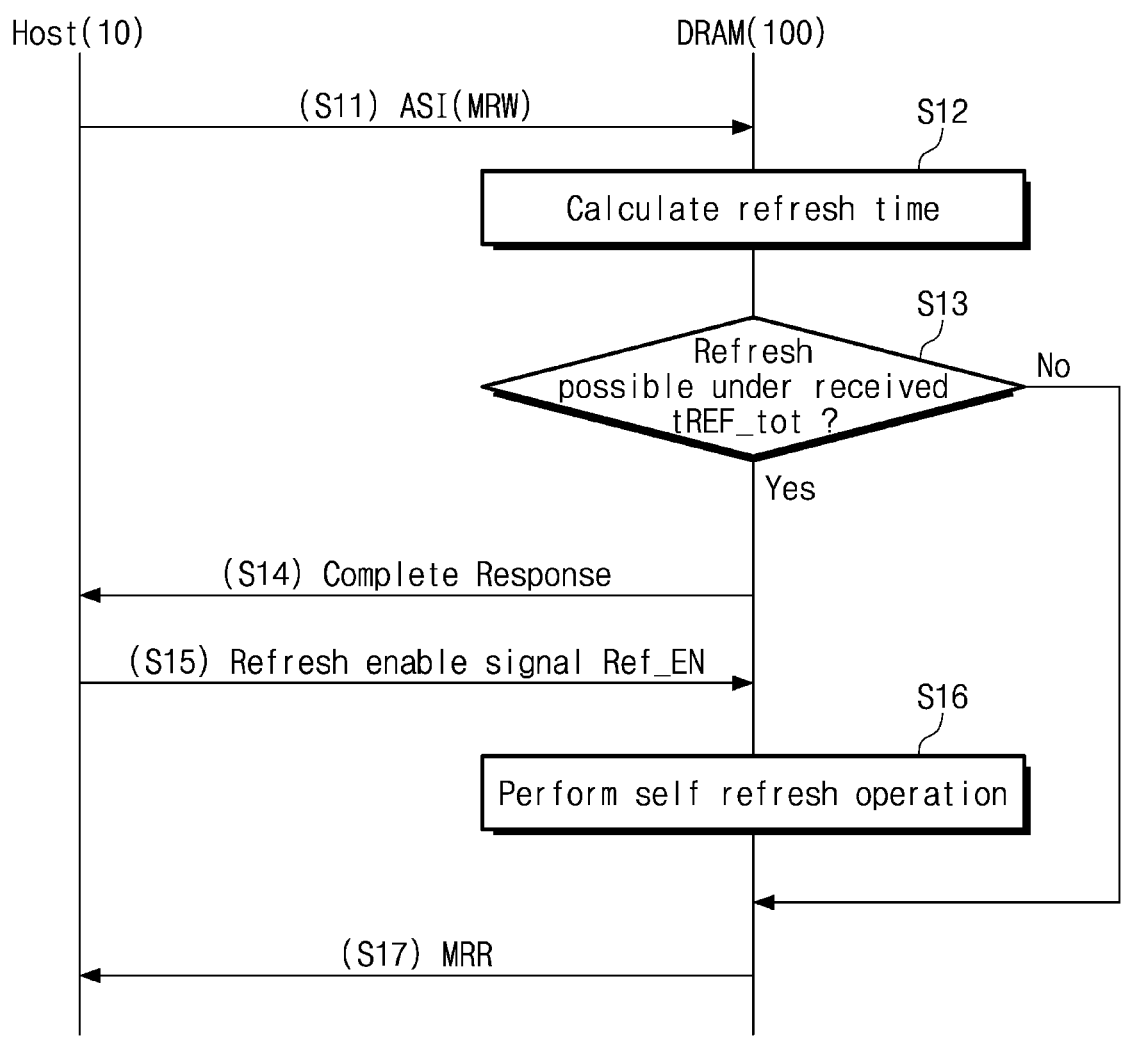
FIG. 8 is a view illustrating interaction between the host and the DRAM in the memory system of the inventive concept.

FIG. 8 is a view illustrating interaction between a host and a DRAM in a memory system of the inventive concept. Referring to FIG. 8, the host 10 may notify the DRAM 100 of the total refresh time tREF_tot of the access scenario information ASI through mode register write (MRW). The DRAM 100 may calculate the optimal refresh time tRC_opt based on the total refresh time tREF_tot.

In operation S11, the host 10 may transmit the access scenario information ASI to the DRAM 100 through mode register write (MRW). The data retention time tRETN when data have to be retained in the DRAM 100 and the total refresh time tREF_tot when execution of a refresh operation is possible during the data retention time tRETN may be included in the access scenario information ASI.

In operation S12, the DRAM 100 calculates the refresh time tRC based on the total refresh time tREF_tot.

In operation S13, the DRAM 100 may detect whether the calculated refresh time tRC is shorter than a reference time. The case where the calculated value of the refresh time tRC is shorter than the reference time (No) means that it is impossible to refresh all rows through a self-refresh operation of the DRAM 100 during only the non operational periods NOP of the scenario. Accordingly, the procedure proceeds to operation S17, in which the DRAM 100 provides the host 10 with a mode register read (MRR) value indicating that it is impossible to perform a self-refresh operation. However, the case where the calculated value of the refresh time tRC is longer than or equal to the reference time (Yes) means that it is possible to refresh all rows at least once through the self-refresh operation of the DRAM 100. Accordingly, the procedure proceeds to operation S14.

In operation S14, the DRAM 100 may transmit, to the host 10, a response providing notification that the refresh time tRC calculation is completed.

In operation S15, the host 10 transmits the refresh enable signal Ref_EN to the DRAM 100.

In operation S16, the DRAM 100 may perform self-refresh operations depending on the refresh time tRC while the refresh enable signal Ref_EN is activated.

An operation in which the DRAM 100 calculates the refresh time tRC based on the access scenario information ASI provided from the host 10 and performs an optimal self-refresh operation without an external refresh command is described above.

Figure 9:
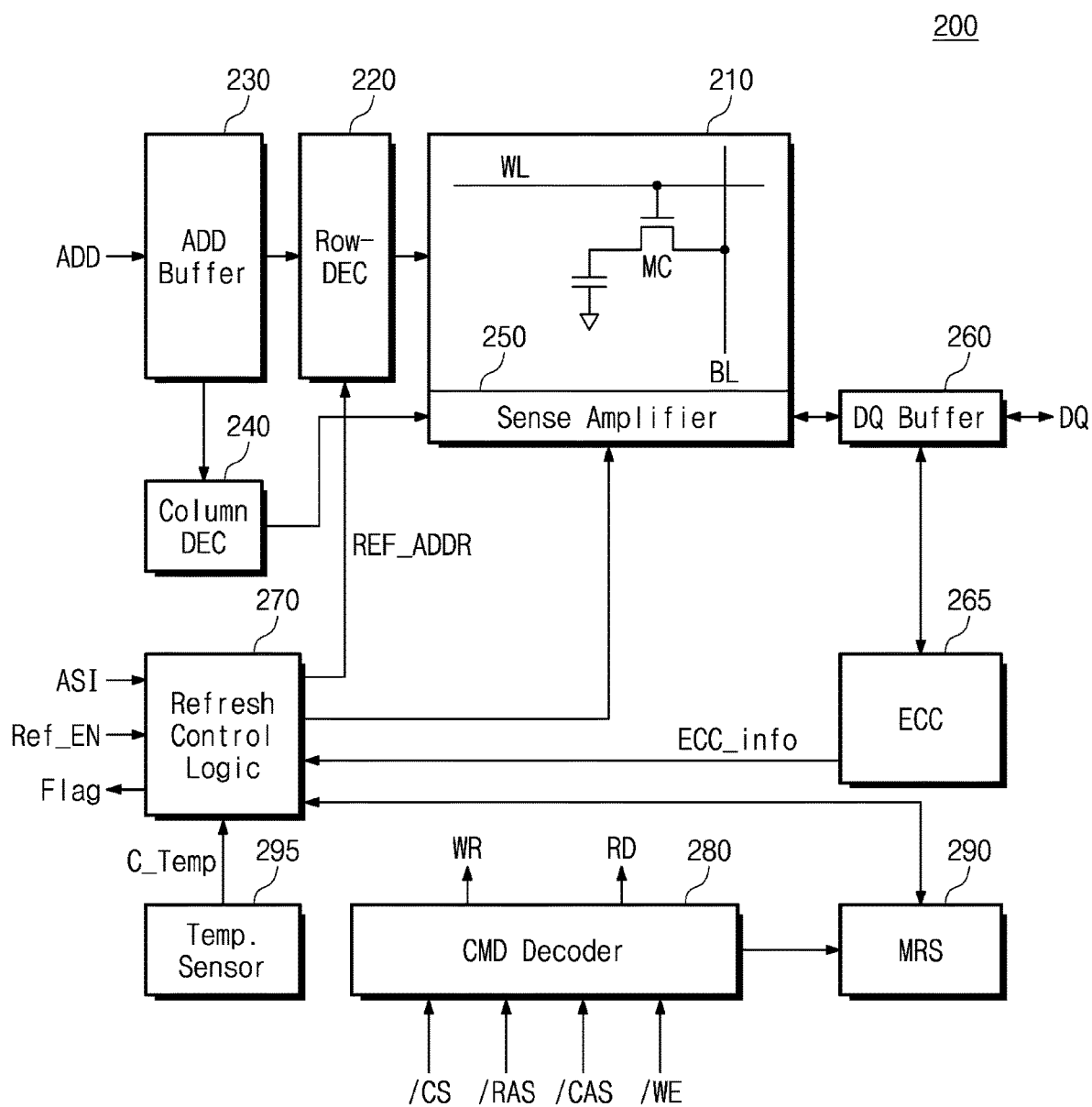
FIG. 9 is a block diagram illustrating the DRAM that performs a scenario-based refresh operation according to another embodiment of the inventive concept.

FIG. 9 is a block diagram illustrating a DRAM that performs a scenario-based refresh operation according to another embodiment of the inventive concept. Referring to FIG. 9, a DRAM 200 may include a cell array 210, a row decoder 220, an address buffer 230, a column decoder 240, a sense amplifier 250, a data buffer 260, an error correction circuit 265, refresh control logic 270, a command decoder 280, a mode register set 290, and a temperature sensor 295. Here, the cell array 210, the row decoder 220, the address buffer 230, the column decoder 240, the sense amplifier 250, the data buffer 260, the command decoder 280, the mode register set 290, and the like are substantially the same as those of FIG. 4 described above, and thus, a detailed description thereof will not be repeated here.

In general, the refresh period tREF of a memory cell is affected by a temperature. Accordingly, it is possible to perform a refresh operation more efficiently if a driving temperature of the DRAM 200 is considered upon determining the refresh time tRC and by using the access scenario information ASI provided from the outside. In addition, a refresh period may be adjusted according to the number of allowable fail bits of the fail bit mode register 174 of FIG. 6B described above. This means that it is possible to adjust a refresh period of respective rows depending on an error correction capability.

The refresh control logic 270 performs the refresh operation of the cell array 210 by using the access scenario information ASI provided from the host 10. The refresh control logic 270 may perform the refresh operation of the DRAM 200 without control of the command decoder 280, such as in a self refresh mode where external refresh commands are not responsible for triggering internal refresh operations. The refresh control logic 270 may recognize the data retention time tRETN defined in an access scenario of the host 10 from the access scenario information ASI. The refresh control logic 270 may obtain lengths and the number of non-operation periods NOP existing within the data retention time tRETN from the access scenario information ASI, to calculate a length of the whole non-operation period. Accordingly, a refresh time for each word line may be determined to refresh all word lines. A frequency of the refresh clock Ref_CLK may be determined by using the determined time.

The error correction circuit 265 is provided as an on-chip error detection and correction circuit embedded in the DRAM 200. The error correction circuit 265 may perform ECC encoding on data input through the data buffer 260 to obtain an error correction code that is stored with the data in the cell array 210. The error correction circuit 265 may perform ECC decoding on data read from cell array 210 to be transmitted externally through the data buffer 260. The error correction circuit 265 may perform ECC encoding in the following manner: 1) data are divided into a plurality of codewords, 2) a parity capable of detecting an error of each codeword is generated, and 3) the parity is added to each codeword. The error correction circuit 265 detects whether an error exists, by using the parity upon performing ECC decoding. For example, in ECC decoding that is performed by using the BCH (Bose-Chaudhuri Hocquenghem) code, an error bit and an error location may be detected by using the parity. If the error location is detected, the error correction circuit 265 may correct an error by overwriting an error-corrected bit on a bit corresponding to the error location on the data buffer 260 (e.g., through bit switching). In particular, the error correction circuit 265 may provide information ECC_info about the correctable error bit count to the refresh control logic 270.

The temperature sensor 295 may sense an internal driving temperature of the DRAM 200 and may provide current temperature information C_Temp being the sensed result to the refresh control logic 270. For example, a thermoelectromotive force (or thermocouple) sensor using an electromotive force varying with a temperature, a thermal conductivity sensor sensing a value of a resistor varying with a temperature, and the like may be used as the temperature sensor 295. However, a temperature measuring manner of the temperature sensor 295 is not limited thereto. For example, various manners may be applied to the temperature sensor 295.

The refresh control logic 270 may determine the refresh time tRC when one row is refreshed, with reference to the number of rows and a cell characteristic. In particular, the refresh control logic 270 may execute a refresh operation within the non-operation period NOP with reference to at least one of the error correction information ECC_info, the current temperature information C_Temp, and the determined refresh time tRC. In the refresh control logic 270, the fail bit mode register 174 of FIG. 6B described above may be set by the error correction information ECC_info.

The refresh control logic 270 may combine the access scenario information ASI provided from the outside and the error correction information ECC_info and/or the current temperature information C_Temp to determine the optimal refresh time tRC_opt of each of memory cells or each of rows. The refresh control logic 270 may perform the refresh operation on the respective memory cells or the respective rows depending on the determined optimal refresh time tRC_opt within a period where the refresh enable signal Ref_EN is activated. For example, refresh operations may be performed at intervals spaced apart by tRC_opt.

Also, the refresh control logic 270 may transmit, to the outside, a flag signal via MRR providing notification that a time to perform the refresh operation is insufficient, in consideration of the access scenario information ASI and/or the error correction information ECC_info and/or the current temperature information C_Temp. That is, the refresh control logic 270 may determine whether the total refresh time tREF_tot provided in the access scenario information ASI is insufficient, in consideration of the error correction information ECC_info and/or the current temperature information C_Temp. Such determination may occur during a scenario operation (e.g., during the writing and/or reading of image data to the cell array 210) after the refresh control logic 270 had initially determined that the total refresh time tREF_tot was sufficient (such as described elsewhere herein).

The command decoder 280 determines an input command with reference to signals /RAS, /CAS, and /WE applied from the outside. The command decoder 280 may write or read data in or from the cell array 210 in response to a command provided from the outside. Also, the command decoder 280 may write data in the mode register set 290 depending on a command and an address provided from the outside. The command decoder 280 of the inventive concept need not include a decoding part that recognizes an auto refresh command and directs the refresh operation (although this may be also be provided).

The DRAM 200 according to an embodiment of the inventive concept may perform a self-refresh operation by using the access scenario information ASI provided from the outside, and/or the error correction information ECC_info (or a fail bit count) and/or the current temperature information C_Temp.

Figure 10:
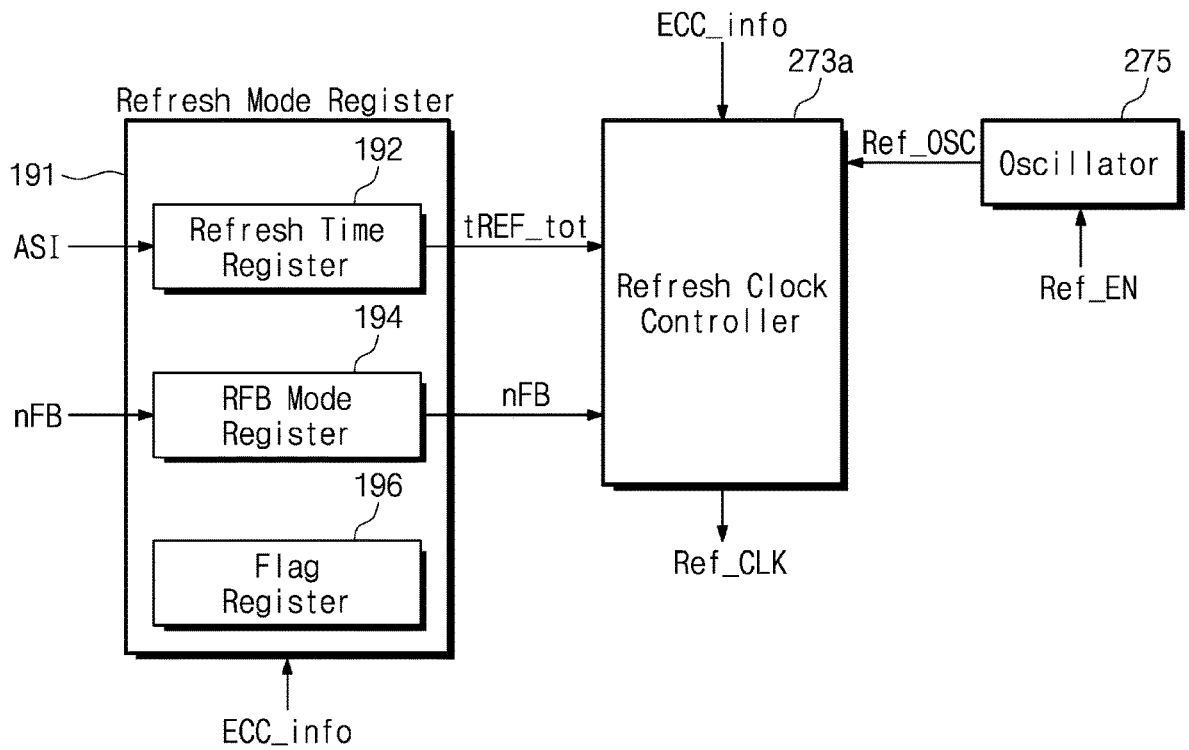
FIG. 10 is a block diagram illustrating an embodiment of the refresh control logic of FIG. 9.

FIG. 10 is a block diagram illustrating an embodiment of refresh control logic of FIG. 9. Referring to FIG. 10, refresh control logic 270a may include a refresh clock controller 273a in communication with the refresh mode register 191, and an oscillator 275.

The refresh mode register 191 may include a refresh time register 192 and a fail bit mode register 194. The refresh time register 191 stores the total refresh time tREF_tot included in the access scenario information ASI, and the total refresh time tREF_tot may mean a time when a self-refresh operation can be performed. For example, information about the total length of non-operation periods included in the data retention time tRETN may be the total refresh time tREF_tot. Of course, it may be understood that length information of the data retention time tRETN is further included in the refresh mode register 191.

The fail bit mode register 194 is a register for providing the refresh period tREF of a cell according to the number of allowable fail bits. That is, a refresh period for each row may be provided according to the correction capability of the error correction circuit 265 provided within the DRAM 200. The fail bit mode register 194 may be programmed with the number of erroneous bits per block of data (e.g., per image) that are acceptable for the scenario (this may be set by a user of the host 10, e.g.). The error correction information ECC_info provided from the error correction circuit 265 may be provided to the refresh clock controller 273a to determine an optimal refresh period tREF which may be used to determine an optimal refresh time tRC. A refresh period for each row or memory cells may increase as the error correction capability becomes greater. This means that the number of refresh operations for securing the reliability of data decreases.

The refresh clock controller 273a determines the refresh time tRC of each row with reference to the total refresh time tREF_tot and/or the fail bit count nFB provided from the refresh mode register 191. That is, if the number of times of a refresh operation and a period associated with all rows are determined according to access scenario information ASI, the refresh clock controller 273a may adjust a frequency of the refresh clock Ref_CLK in accordance with the fail bit count nFB. For example, ECC_info may comprise a detected number of erroneous uncorrectable bits (or a number of both the correctable and a detected number of uncorrectable bits) of a block of data of a scenario. For example, during time T2 to T3 in FIG. 2, the data read from cell array 210 (such as a frame image of a video) may be checked for errors by ECC 265. Depending on the number of errors of data associated with an ECC code, ECC 265 may be able to correct or not correct the erroneous bits. ECC 265 may provide a number of erroneous bits of the block of data (e.g., of the frame data) to refresh control logic 270 as ECC_info. If the number of erroneous bits of the block of data exceeds the acceptable fail bit number nFB as set forth in the RFB mode register 194, the refresh period tREF may be decreased to increase the frequency of the refresh operations and thus decrease the refresh time refresh time tRC between each successive refresh operation (that may be calculated based upon the modified the refresh period tREF as described elsewhere herein). Accordingly, the refresh clock controller 273a may adjust the refresh clock Ref_CLK for an optimal refresh operation.

Figure 11:
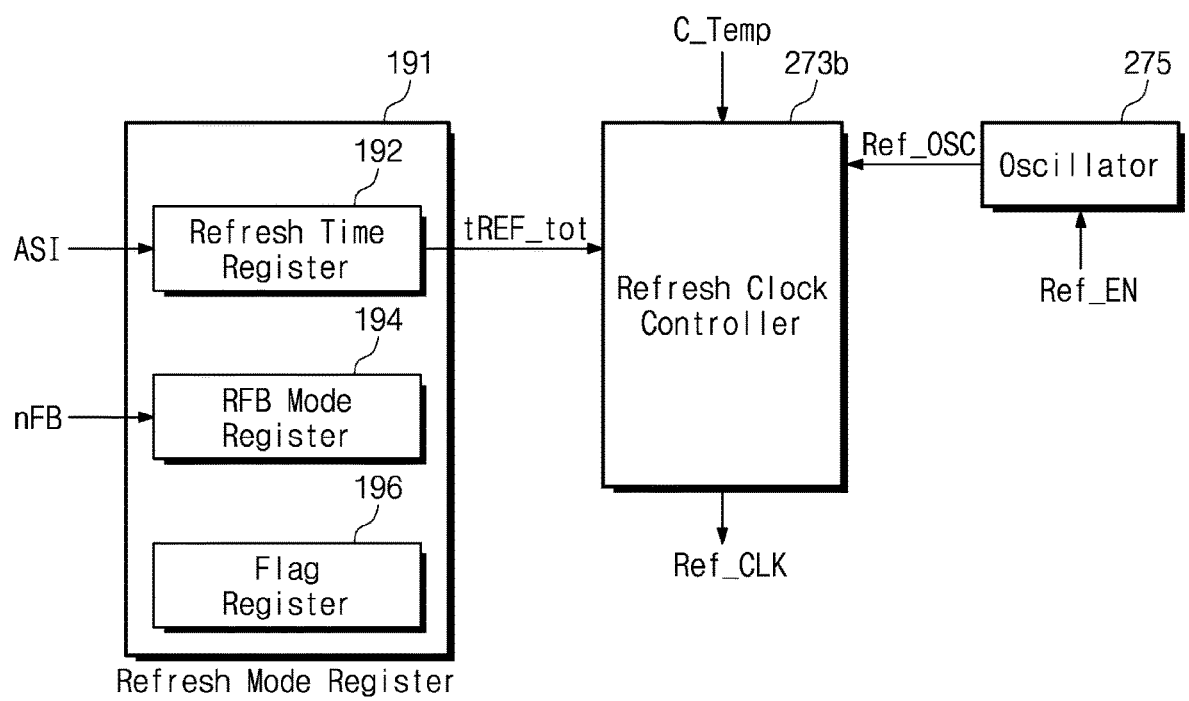
FIG. 11 is a block diagram illustrating another embodiment of the refresh control logic of FIG. 9.

FIG. 11 is a block diagram illustrating another embodiment of refresh control logic of FIG. 9. Referring to FIG. 11, refresh control logic 270b may include a refresh clock controller 273b in communication with the refresh mode register 191, and the oscillator 275.

The refresh mode register 191 may include the refresh time register 192 and the fail bit mode register 194. The refresh time register 192 stores the total refresh time tREF_tot included in the access scenario information ASI, and the total refresh time tREF_tot may mean a time when a self-refresh operation can be performed. The refresh mode register 191 may provide the stored total refresh time tREF_tot to the refresh clock controller 273b. In this case, the number of allowable fail bits nFB stored in the fail bit mode register 194 may not be provided to the refresh clock controller 273b.

The refresh clock controller 273b may determine the refresh time tRC of each row with reference to the total refresh time tREF_tot provided from the refresh mode register 191 and/or the current temperature information C_Temp provided from the temperature sensor 295. That is, the refresh clock controller 273b may calculate the optimal refresh time tRC_opt at a current temperature. To calculate the optimal refresh time tRC_opt based on a temperature, the refresh control logic 270b may further include a separate mapping table. For example, a mapping table may provide different refresh period tREF durations for different operating temperatures of the DRAM 100 (e.g., shorter refresh period tREF durations for higher operating temperatures). The current temperature information C_Temp provided from the temperature sensor 295 may be used to select a refresh period tREF duration from the mapping table, the selected tREF duration being used to calculate the refresh time tRC which is then used by refresh clock controller to generate the refresh clock Ref_CLK as described herein.

If the number of times of a refresh operation and a period associated with all rows or memory cells are determined, the refresh clock controller 273b may adjust a frequency of the refresh clock Ref_CLK. Accordingly, the refresh clock controller 273b may generate the adjusted refresh clock Ref_CLK for an optimal refresh operation.

Figure 12:
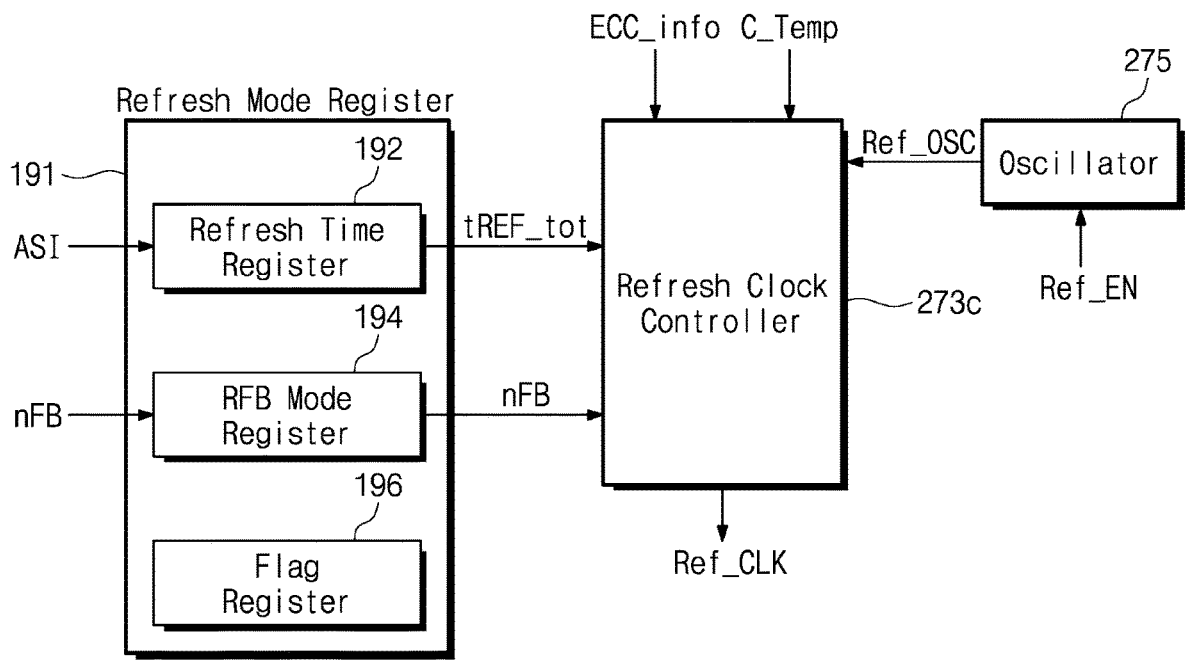
FIG. 12 is a block diagram illustrating another embodiment of the refresh control logic of FIG. 9.

FIG. 12 is a block diagram illustrating another embodiment of refresh control logic of FIG. 9. Referring to FIG. 12, refresh control logic 270c may include a refresh clock controller 273c in communication with the refresh mode register 191, and the oscillator 275.

The refresh mode register 191 may include the refresh time register 192 and the fail bit mode register 194. The refresh time register 192 stores the total refresh time tREF_tot included in the access scenario information ASI, and the total refresh time tREF_tot may mean a time when a self-refresh operation can be performed. The refresh mode register 191 may provide the stored total refresh time tREF_tot to the refresh clock controller 273c. The fail bit mode register 194 is a register for providing a refresh period tREF of a cell according to the number of fail bits nFB allowable in a refresh operation. That is, a refresh period for each row may be provided according to the correction capability of the error correction circuit 265 provided within the DRAM 200. The refresh clock controller 273c receives the total refresh time tREF_tot provided from the refresh mode register 191, the number of fail bits nFB allowable in the refresh operation provided from the refresh mode register 191, and the current temperature information C_Temp provided from the temperature sensor 295. The refresh clock controller 273c may calculate the optimal refresh time tRC_opt of each row with reference to the total refresh time tREF_tot, the number of fail bits nFB allowable in the refresh operation, and the current temperature information C_Temp.

If optimal refresh time tRC_opt of each row is determined, the refresh clock controller 273c may adjust a frequency of the refresh clock Ref_CLK. Accordingly, the refresh clock controller 273c may generate the adjusted refresh clock Ref_CLK' for an optimal refresh operation.

The embodiments of the refresh control logic 270 that determines an optimal refresh operation depending on the access scenario information ASI provided from the outside, the error correction capability of the DRAM 200, and a current driving temperature are described above. However, it may be well understood that the refresh control logic 270 calculates the optimal refresh time tRC_opt with reference to a characteristic (e.g., a process characteristic) of the DRAM 200 in addition to or instead of operating temperature or an error correction capability.

Figure 13:
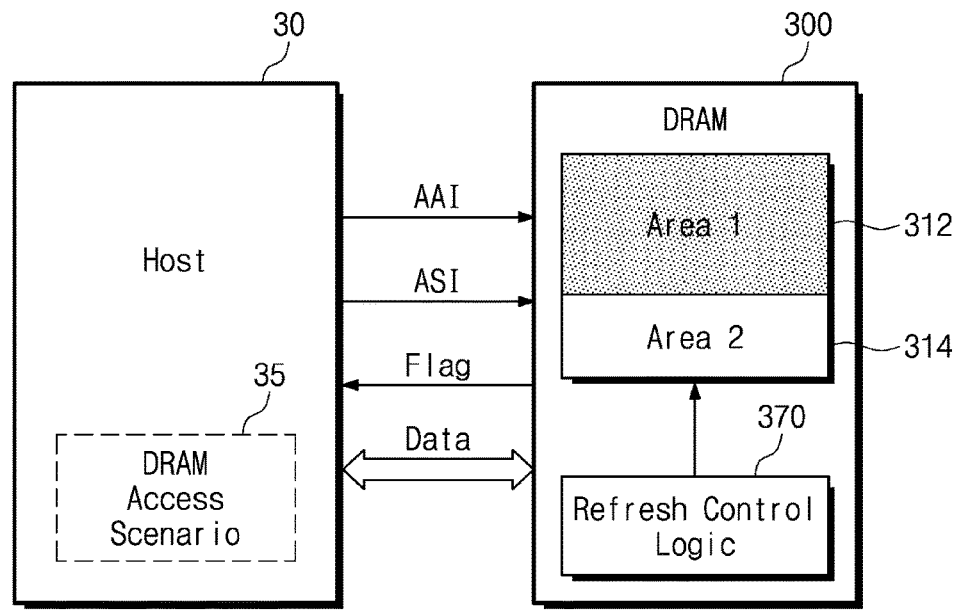
FIG. 13 is a block diagram illustrating the memory system according to another embodiment of the inventive concept.

FIG. 13 is a block diagram illustrating a memory system according to another embodiment of the inventive concept. Referring to FIG. 13, a memory system according to another embodiment of the inventive concept may include a host 30 and a DRAM 300.

The host 30 may use the DRAM 300 as a buffer, a working memory, or a main memory. In particular, the host 30 accesses the DRAM 300 based on a scenario. For example, the host 30 may access the DRAM 300 in a way to write data of a fixed capacity and retain the stored data only during a given time. That is, the host 30 may use the DRAM 300 as a scenario-based buffer memory.

The host 30 may internally include a fixed DRAM access scenario 35 for accessing the DRAM 300. The host 30 may access the DRAM 300, for example, in two manners. For example, the host 30 may access a first area 312 of the DRAM 300 in compliance with a rule of the DRAM access scenario 35, but may access a second area 314 of the DRAM 300 in a random access manner. Accordingly, the host 30 may transmit the access scenario information ASI to the DRAM 300 to configure the DRAM to perform self refresh operations of the first area 312 based on the DRAM access scenario 35. The host 30 may provide access area information AAI for to the DRAM 300 to reserve the first area 312 for access based on the DRAM access scenario 35. In contrast, the host 30 may provide access area information AAI for a random access to the DRAM 300 upon accessing the second area 314. The access area information AAI may be used to define a segment of the cell array (e.g., a size of memory, such as a number of cell rows) and may be provided in the form of an address or in the form of register write.

The DRAM 300 may refresh a cell array 310 depending on the access area information AAI or the access scenario information ASI provided from the host 30. If the access area information AAI corresponds to the first area 312 for a scenario-based access, the DRAM 300 may perform a self-refresh operation by using the access scenario information ASI without using an externally received refresh command. If the access area information AAI corresponds to the second area 314 for a random access, the DRAM 300 may perform a refresh operation on the second area 314 conventionally, (e.g., using an auto refresh command). The refresh control logic 370 of the DRAM 300 may perform a self-refresh operation for the first area 312 of the memory identified by the access area information AAI and during the same time period may perform an auto refresh operation or other conventional refresh operations for the second portion 314 of the memory identified by access area information AAI. Thus, DRAM 300 may be configured to perform self-refresh and auto refresh during the same time period without changing a refresh mode of DRAM 300.

Figure 14:
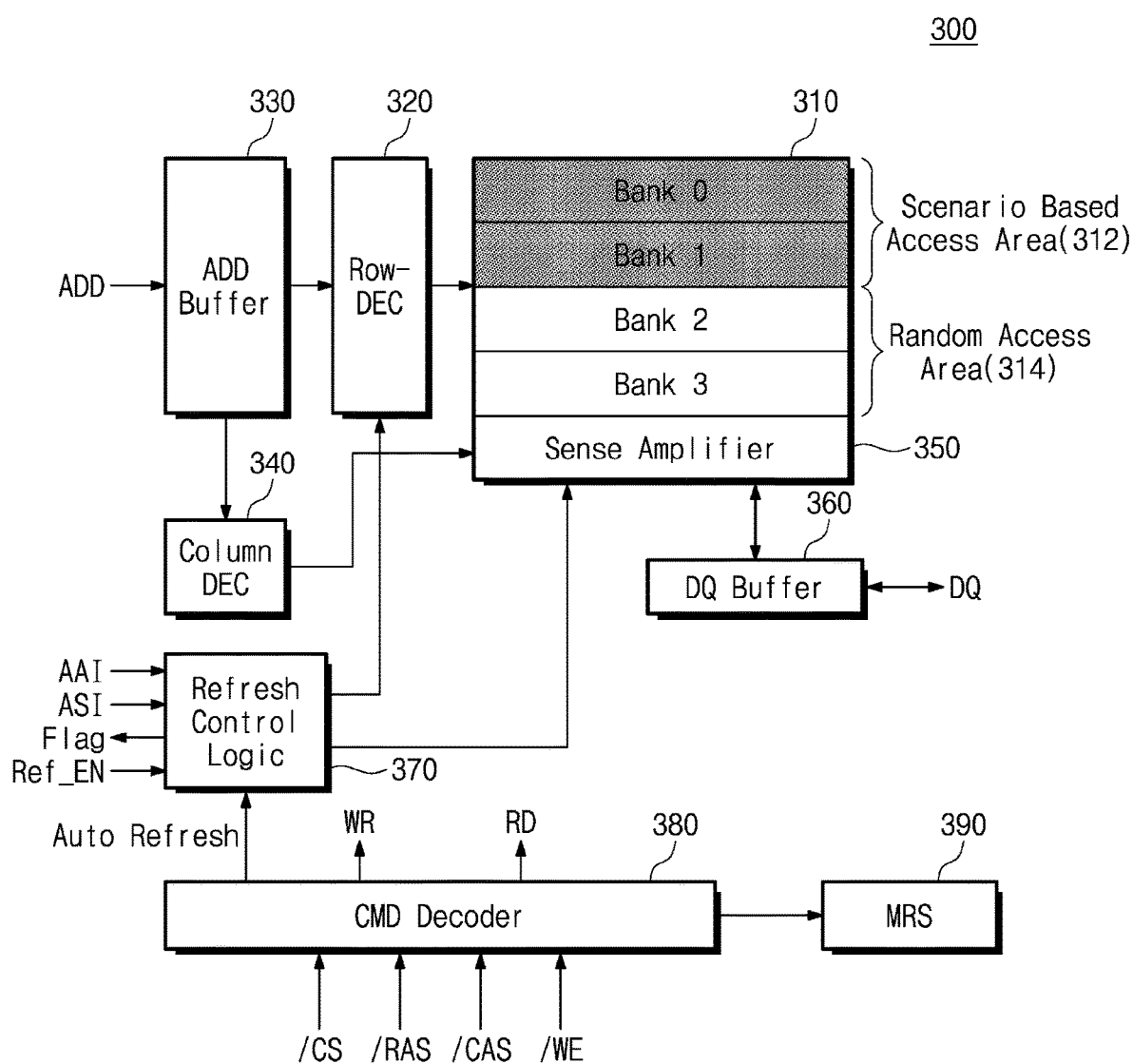
FIG. 14 is a block diagram illustrating an example of the DRAM of FIG. 13.

FIG. 14 is a block diagram illustrating an example of a DRAM of FIG. 13. Referring to FIG. 14, the DRAM 300 may include a cell array 310, a row decoder 320, an address buffer 330, a column decoder 340, a sense amplifier 350, a data buffer 360, the refresh control logic 370, a command decoder 380, and a mode register set 390. Here, the row decoder 320, the address buffer 330, the column decoder 340, the sense amplifier 350, the data buffer 360, the mode register set 390, and the like are substantially the same as those of FIG. 4 described above, and thus, a detailed description thereof will not be repeated here.

The cell array 310 may be activated and accessed in units of a plurality of banks (e.g., Bank0 to Bank3). The plurality of banks may be classified into the first area 312 accessed according to the access scenario information ASI and the second area 314 randomly accessed regardless of the access scenario information ASI. The banks of the cell array 310 may operate in parallel such that access operations (e.g., read, write or refresh operations) may be performed in different banks at the same time.

The refresh control logic 370 performs a refresh operation of the cell array 310 by using the access area information AAI and the access scenario information ASI provided from the host 30 (refer to FIG. 13). In the case where the access area information AAI corresponds to the first area 312, the refresh control logic 370 may perform the refresh operation as a self refresh operation without control of the command decoder 380 as described herein. In contrast, in the case where the access area information AAI corresponds to the second area 314, the refresh control logic 370 may perform the refresh operation on a selected memory area depending on an auto refresh command (or other externally received command) received by and decoded by the command decoder 380.

The command decoder 380 determines an input external command with reference to signals /RAS, /CAS, and /WE applied from the an external source, such as DRAM controller 18. The command decoder 380 may write or read data in or from the cell array 310 in response to an externally received command. Also, the command decoder 380 may write data in the mode register set 390 depending on a command and an address provided from an external source. In some examples, the command decoder 380 may bypass a refresh operation that would otherwise correspond to an access to the first area 312. In contrast, the command decoder 380 may refresh memory cells based on a refresh command provided from the outside that corresponds to an access to the second area 314. For example, auto refresh operations performed by command decoder 380 may comprise receiving and decoding an auto refresh command from an external source, initiating an internal refresh operation for a row identified by the address provided by an auto refresh address counter, and incrementing the auto refresh address counter. In addition, command decoder 380 may determine that the address of the auto refresh address counter corresponds to an address of a row within the first area 312 (e.g., such as comparing the address of the auto refresh address counter to a range of addresses identified by the access area information AAI) and in response to this determination, bypass the initiation of an internal refresh operation for that row and increment the auto refresh address counter. Refresh of rows within the first area 312 may instead be refreshed according to the self refresh operations based on access scenario information ASI as described elsewhere herein (e.g., based on Ref_CLK provided by refresh clock controller used to initiate a refresh operation of row identified by an address of a different address counter as described herein). The DRAM 300 of the inventive concept performs the refresh operation of the cell array 310 by using the access area information AAI and the access scenario information ASI provided from the outside. In the event where it is impossible to refresh a memory cell by using the access scenario information ASI, the DRAM 300 may provide a flag via a mode register read (MRR) to an external device to inform the same. The second area 314 in which an auto refresh operation is possible may be selected under control of the host 30.

Although not illustrated in FIG. 14, it may be well understood that the DRAM 300 further includes an error correction circuit (ECC) or a temperature sensor. When performing the refresh operation by using the access scenario information ASI, the DRAM 300 may determine the optimal refresh time tRC_opt with reference to a current temperature and the number of allowable fail bits.

Figure 15:
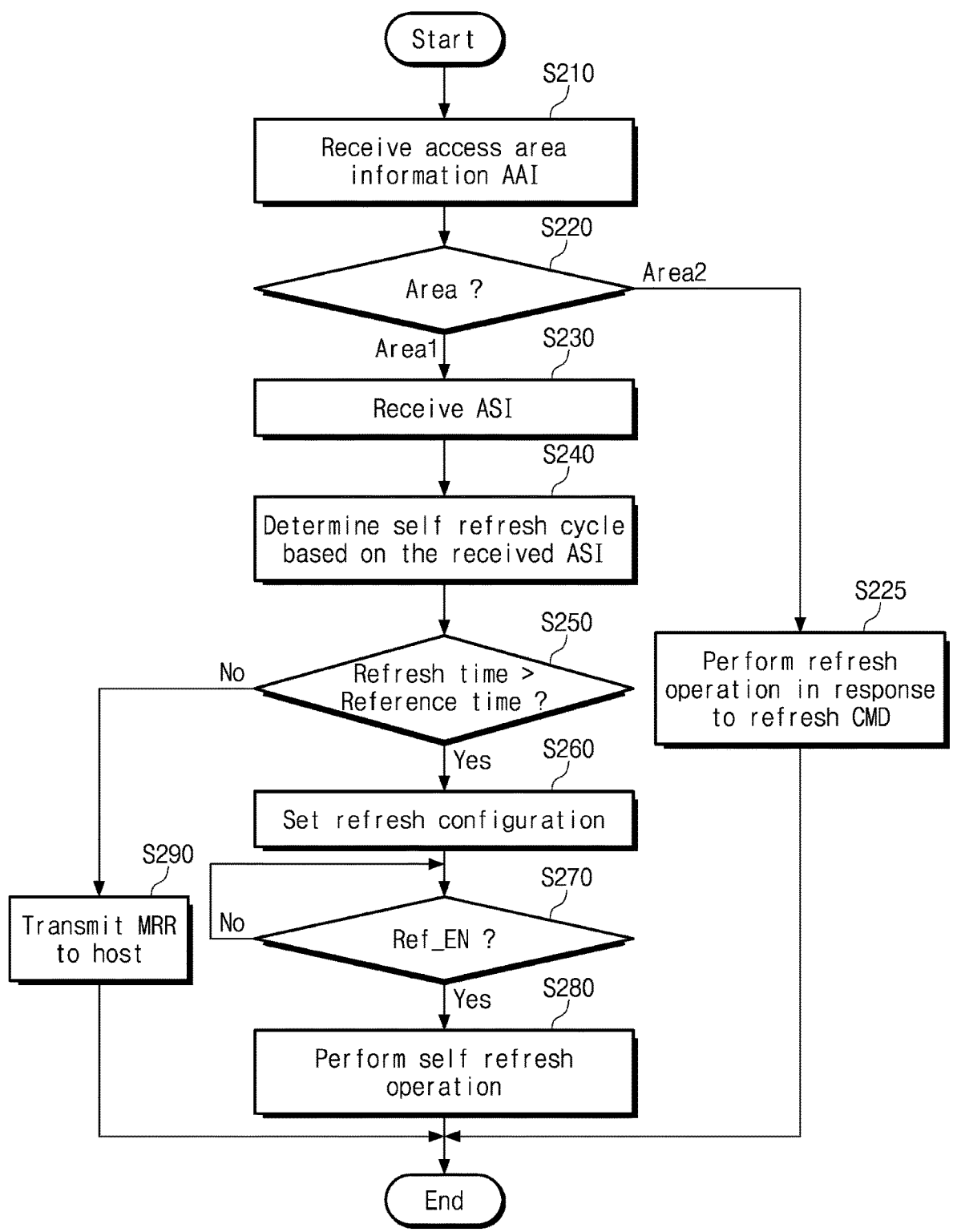
FIG. 15 is a flowchart illustrating an operation of the refresh control logic of FIG. 14.

FIG. 15 is a flowchart illustrating an operation of refresh control logic of FIG. 14. Referring to FIG. 15, the refresh control logic 370 performs a refresh operation of the cell array 310 by using the access area information AAI and the access scenario information ASI provided from the host 30.

In operation S210, the refresh control logic 370 receives the access area information AAI from the host 30. The access area information AAI may be stored by the DRAM 300 in a register, such as storing in a mode register via a mode register write (MRW) operation.

In operation S220, the refresh control logic 370 performs an operation branch depending on the access area information AAI. If the access area information AAI indicates the first area 312 allocated to a scenario-based access area, the procedure proceeds to operation S230. In contrast, if the access area information AAI indicates the second area 314 allocated to a random access area, the procedure proceeds to operation S225.

In operation S225, the refresh control logic 370 may perform refresh operations on rows within a selected memory area based on subsequently received refresh commands provided from an external source regardless of the access scenario information ASI. For example, the refresh control logic 370 may perform the refresh operations on rows within the selected memory area in response to subsequently received auto refresh commands (or externally received refresh commands provided with row addresses identifying particular rows to be refreshed) decoded by the command decoder 380.

In operation S230, the refresh control logic 370 receives the access scenario information ASI from the host 30. The refresh control logic 370 may check the total refresh time tREF_tot and the data retention time tRETN from the access scenario information ASI as described herein.

In operation S240, the refresh control logic 370 may calculate a refresh time tRC between initiation of refresh operations memory cells or memory cell rows by using the access scenario information ASI provided from the host 30 (e.g., according to any of the various embodiments described herein). For example, the refresh time tRC may be calculated by dividing the total refresh time tREF_tot (or available total refresh time within a refresh window tREFW) obtained from the access scenario information ASI by the number of rows. The number of rows may be the number of rows within Area1 identified by the access area information). Also, the refresh control logic 370 may determine and/or adjust the refresh time tRC by using temperature information and/or fail bit information as described elsewhere herein.

In operation S250, the calculated refresh time tRC is compared with a reference time. The case where the calculated refresh time tRC is longer than the reference time (Yes) means that it is possible to perform a self-refresh operation in the DRAM 300. Accordingly, the procedure proceeds to operation S260. In contrast, the case where the refresh time tRC is shorter than or equal to the reference time (No) means that it is impossible to perform a self-refresh operation according to the total refresh time tREF_tot. Accordingly, the procedure proceeds to operation S290 for the purpose of notifying the outside of the DRAM 300 that it is impossible to refresh all rows within the total refresh time tREF_tot.

In operation S260, the refresh control logic 370 sets the refresh time tRC such as by writing to a register of the refresh control logic 370 (as described elsewhere herein) to thereby configure refresh control logic 370 to initiate internal refresh operations periodically at intervals equal to the calculated refresh time when refresh enable signal Ref_EN has an enabled state.

In operation S270, the refresh control logic 370 monitors the refresh enable signal Ref_EN from the host 30. For example, the refresh enable signal Ref_EN may be activated in the non-operation period NOP by host 10. If the refresh enable signal Ref_EN is not activated (i.e., Ref_EN does not have an enabled state), the refresh control logic 370 may continue to monitor activation of the refresh enable signal Ref_EN. If it is detected that the refresh enable signal Ref_EN is activated, the procedure proceeds to operation S280.

In operation S280, the refresh control logic 370 may perform the self-refresh operation of those rows within Area1 depending on the refresh time tRC (e.g., periodically at intervals spaced apart by tRC) during a period where the refresh enable signal Ref_EN is activated (i.e., has an enabled state).

In operation S290, the refresh control logic 370 may provide a signal for notifying the outside that it is impossible to refresh all rows at least once based on the given total refresh time tREF_tot. For example, it may be possible to provide notification that it is impossible to perform a refresh operation, through mode register read (MRR) and flag register 196. In this case, the host 30 may perform a refresh operation through a command. Alternatively, the host 30 may increase the length of the non-operation periods NOPs to increase the total refresh time tREF_tot and the process may return to step S230 with modified access scenario information ASI.

As described above, the refresh control logic 370 of the inventive concept may perform auto refresh operations and self-refresh operations with the same configuration (e.g., without switching from one refresh mode to another refresh mode) where the self-refresh operations do not require receipt of an external command to initiate a refresh operation. Whether an auto refresh operation or a self-refresh operation may be dependent command on a selected memory area as identified by externally received information that may be programmed into the DRAM.

Figure 16:
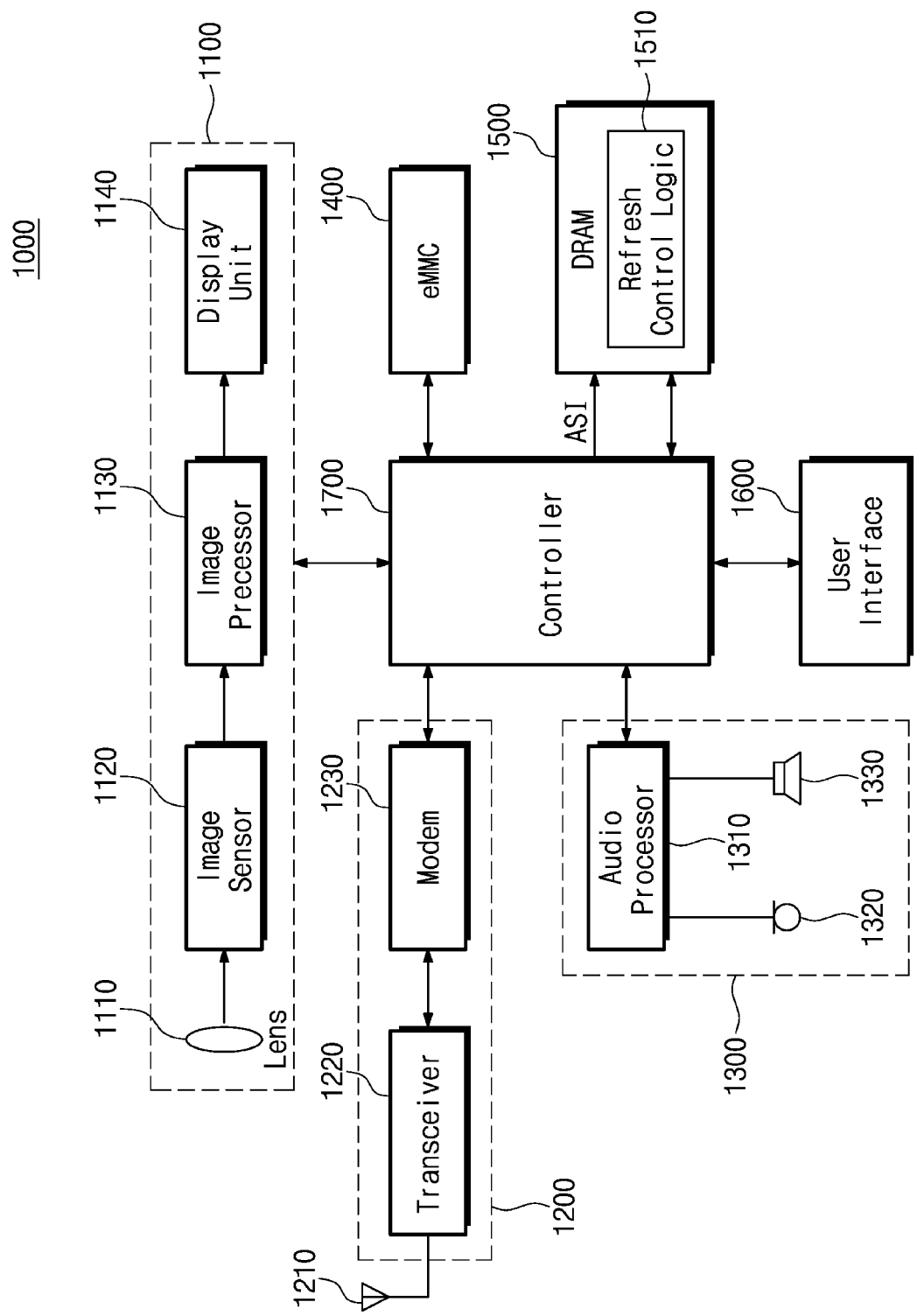
FIG. 16 is a block diagram illustrating a portable terminal including a semiconductor memory device according to an embodiment of the inventive concept.

FIG. 16 is a block diagram illustrating a portable terminal according to an embodiment of the inventive concept. Referring to FIG. 16, a portable terminal 1000 according to an embodiment of the inventive concept includes an image processing unit 1100, a wireless transceiver unit 1200, an audio processing unit 1300, an eMMC 1400, a DRAM 1500, a user interface 1600, and a controller 1700.

The image processing unit 1100 may include a lens 1110, an image sensor 1120, an image processor 1130, and a display unit 1140. The wireless transceiver unit 1200 includes an antenna 1210, a transceiver 1220, and a modulator/demodulator (modem) 1230. The audio processing unit 1300 includes an audio processor 1310, a microphone 1320, and a speaker 1330. The eMMC 1400 may be a component for data storage. Here, a DRAM 1500 may be used as a working memory of the portable terminal 1000. In addition, the DRAM 1500 may be used as a buffer memory of the image processing unit 1100 such as by storing frames of image data as described herein. The user interface 1600 may be a component for receiving a user input signal.

Here, the DRAM 1500 may be implemented with a mobile DRAM. The DRAM 1500 may include refresh control logic 1510 that refreshes memory cells depending on an optimal refresh time without an external command, when being accessed based on a scenario.

According to an embodiment of the inventive concept, costs needed for a refresh operation may be reduced by improving efficiency of a refresh operation of a semiconductor memory device accessed based on a scenario.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:
1. A semiconductor memory device comprising:
a cell array including a plurality of DRAM cells to store data; and
refresh control logic configured to refresh the plurality of DRAM cells according to access scenario information provided from an external source,
wherein the refresh control logic is configured to determine a refresh time of the plurality of DRAM cells with reference to the access scenario information and a retention characteristic of the plurality of DRAM cells, and is configured to refresh the plurality of DRAM cells according to the determined refresh time, and
wherein the access scenario information includes:
a data retention time indicating a duration that the data should be retained in the plurality of DRAM cells; and
a total refresh time comprising the total duration of at least one non-operation period within the data retention time where external access to the plurality of DRAM cells is not permitted.
2. The semiconductor memory device of claim 1, wherein the refresh control logic divides a portion of the total refresh time corresponding to a refresh window by a number of rows of the cell array to be refreshed to calculate the refresh time.
3. The semiconductor memory device of claim 1, wherein, if the determined refresh time is shorter than predetermined value, the refresh control logic outputs refresh-unavailable information to an external device.
4. The semiconductor memory device of claim 1, further comprising a refresh mode register in communication with the refresh control logic
including a refresh time register configured to store the total refresh time; and
a fail bit mode register configured to store a value indicative of an acceptable number of fail bits.
5. The semiconductor memory device of claim 4, wherein the refresh control logic further includes:
a refresh clock controller configured to adjust a frequency of a refresh clock in response to at least one of the total refresh time and the acceptable number of fail bits indicated by the refresh mode register.
6. The semiconductor memory device of claim 1, wherein the refresh control logic is configured to initiate refresh operations of the plurality of DRAM cells in response to an externally received refresh enable signal.
7. The semiconductor memory device of claim 1, further comprising:

a temperature sensor configured to sense an operating temperature of the semiconductor memory device and to provide the sensed operating temperature to the refresh control logic, wherein the refresh control logic is configured to adjust the refresh time according to the sensed operating temperature.

8. The semiconductor memory device of claim 1, further comprising:

a command decoder configured to decode a command received from the external source and to generate an internal control signal in response to the decoded command, wherein the command decoder is not configured to decode a refresh command to initiate a refresh operation.

9. The semiconductor memory device of claim 8, further comprising a refresh mode register configured to store the access scenario information.

10. A memory system comprising:

a host configured to record and read data in a buffer during a data retention time depending on an access scenario; and a DRAM in communication with the host to receive, store and send the data, wherein the DRAM is provided as the buffer of the host and is configured to receive time information of the access scenario, wherein the DRAM is configured to perform self-refresh operations during at least one non-operation period of the access scenario on a memory area where the data received from the host is stored, wherein the host is configured to enable the self-refresh operation of the DRAM by providing a refresh enable signal to the DRAM, wherein the time information of the access scenario includes duration information of the at least one non-operation period of the access scenario, and wherein the DRAM includes refresh control logic configured to calculate a refresh time corresponding to a time duration between initiating refresh of sequentially refreshed rows of the memory area using the duration information of the at least one non-operation period of the access scenario.

11. The memory system of claim 10, wherein the host is an image processing device that uses the DRAM as a frame buffer to store frames of image data.

12. The memory system of claim 10, wherein the refresh control logic is configured to calculate the refresh time also using at least one of an operating temperature of the DRAM and a number of allowable fail bits of the DRAM.

13. The memory system of claim 10, wherein the DRAM includes:

a first memory area that is configured to be accessed at a timing depending on the access scenario; and a second memory area that is configured to be accessed at a timing dependent on receiving external commands outside of the access scenario.

14. The memory system of claim 13, wherein the host is configured to provide access area information to the DRAM and the DRAM is configured to calculate the refresh time for a self-refresh mode for the first memory area, wherein the calculated refresh time is not used in refreshing the second memory.

15. The memory system of claim 14, wherein the DRAM is configured to perform refresh operations of the second memory area as auto refresh operations in response to receiving corresponding auto refresh commands provided by the host.

16. A refresh method of a semiconductor memory device in which data are written and read based on a scenario, the method comprising:

receiving a data retention time according to an access scenario and a length of a non-operation period included in the data retention time from an external source;

calculating a refresh time of a memory area where the data are written using the length of the non-operation period and a characteristic parameter of memory cells; and refreshing the memory area at a timing depending on the calculated refresh time during the non-operation period.

17. The method of claim 16, wherein, in the calculating of the refresh time, the refresh time is determined with reference to a number of acceptable error bits within the data.

18. The method of claim 16, wherein, in the calculating of the refresh time, the refresh time is determined based upon an operation temperature of the semiconductor memory device.

19. The method of claim 16, wherein, in the refreshing, the semiconductor memory device refreshes the memory area by initiating refresh operations when a refresh enable signal is activated during a non-operation period, wherein the timing of the initiation of the refresh operations does not correspond to receipt of any externally received refresh commands.

* * * * *